US011139241B2

(12) United States Patent
Morrow et al.

(10) Patent No.: US 11,139,241 B2
(45) Date of Patent: Oct. 5, 2021

(54) INTEGRATED CIRCUIT DEVICE WITH CRENELLATED METAL TRACE LAYOUT

(71) Applicant: Intel Corporation, Santa Clara, CA (US)

(72) Inventors: Patrick Morrow, Portland, OR (US); Mauro J. Kobrinsky, Portland, OR (US); Mark T. Bohr, Aloha, OR (US); Tahir Ghani, Portland, OR (US); Rishabh Mehandru, Portland, OR (US); Ranjith Kumar, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/348,105

(22) PCT Filed: Dec. 7, 2016

(86) PCT No.: PCT/US2016/065423
§ 371 (c)(1),
(2) Date: May 7, 2019

(87) PCT Pub. No.: WO2018/106233
PCT Pub. Date: Jun. 14, 2018

(65) Prior Publication Data
US 2019/0312023 A1    Oct. 10, 2019

(51) Int. Cl.
*H01L 23/528* (2006.01)
*H01L 27/02* (2006.01)
(Continued)

(52) U.S. Cl.
CPC .......... *H01L 23/528* (2013.01); *G06F 30/392* (2020.01); *G06F 30/394* (2020.01);
(Continued)

(58) Field of Classification Search
CPC ............... G06F 30/392; G06F 30/394; H01L 29/4175; H01L 29/772; H01L 21/76898;
(Continued)

(56) References Cited

U.S. PATENT DOCUMENTS 9,305,834 B1    4/2016   Latypov et al.
2001/0041407 A1    11/2001   Brown
(Continued)

OTHER PUBLICATIONS

International Search Report and Written Opinion for International Patent Application No. PCT/US2016/065423, dated Jul. 28, 2017.
(Continued)

*Primary Examiner* — Nelson Garces
(74) *Attorney, Agent, or Firm* — Green, Howard & Mughal LLP

(57) ABSTRACT

Integrated circuit (IC) cell architectures including a crenellated interconnect trace layout. A crenellated trace layout may be employed where an IC cell includes transistor having a source/drain terminal interconnected through a back-side (3D) routing scheme that reduces front-side routing density for a given transistor footprint. In the crenellated layout, adjacent interconnect traces or tracks may have their ends staggered according to a crenellation phase for the cell. Crenellated tracks may intersect one cell boundary with adjacent tracks intersecting an opposite cell boundary. Track ends may be offset by at least the width of an underlying orthogonal interconnect trace. Crenellated track ends may be offset by the width of an underlying orthogonal interconnect trace and half a spacing between adjacent orthogonal interconnect traces.

13 Claims, 12 Drawing Sheets

(51) Int. Cl.
| | | |
|---|---|---|
| *H01L 21/306* | (2006.01) | |
| *H01L 21/8234* | (2006.01) | |
| *H01L 27/088* | (2006.01) | |
| *H01L 29/08* | (2006.01) | |
| *H01L 29/10* | (2006.01) | |
| *H01L 29/40* | (2006.01) | |
| *H01L 29/66* | (2006.01) | |
| *H01L 29/78* | (2006.01) | |
| *H01L 21/768* | (2006.01) | |
| *H01L 29/417* | (2006.01) | |
| *H01L 29/772* | (2006.01) | |
| *H01L 23/522* | (2006.01) | |
| *G06F 30/392* | (2020.01) | |
| *G06F 30/394* | (2020.01) | |

(52) U.S. Cl.
CPC ...... *H01L 21/30604* (2013.01); *H01L 21/768* (2013.01); *H01L 21/76898* (2013.01); *H01L 21/823418* (2013.01); *H01L 21/823431* (2013.01); *H01L 21/823475* (2013.01); *H01L 23/522* (2013.01); *H01L 27/0207* (2013.01); *H01L 27/088* (2013.01); *H01L 27/0886* (2013.01); *H01L 29/0847* (2013.01); *H01L 29/1095* (2013.01); *H01L 29/401* (2013.01); *H01L 29/4175* (2013.01); *H01L 29/41791* (2013.01); *H01L 29/66636* (2013.01); *H01L 29/66795* (2013.01); *H01L 29/772* (2013.01); *H01L 29/785* (2013.01); *H01L 29/7851* (2013.01)

(58) Field of Classification Search
CPC ............................ H01L 29/785; H01L 23/522; H01L 21/768; H01L 27/088; H01L 29/41791; H01L 21/30604; H01L 21/823418; H01L 21/823431; H01L 21/823475; H01L 27/0207; H01L 27/0886; H01L 29/0847; H01L 29/1095; H01L 29/401; H01L 29/66636; H01L 29/66795; H01L 29/7851; H01L 23/528
See application file for complete search history.

(56) References Cited

U.S. PATENT DOCUMENTS

| | | | |
|---|---|---|---|
| 2004/0119165 | A1 | 6/2004 | Baukus et al. |
| 2011/0278676 | A1 | 11/2011 | Cheng et al. |
| 2013/0162346 | A1 | 6/2013 | McElvain et al. |
| 2013/0334576 | A1* | 12/2013 | Park ...................... G06F 30/394 |
| | | | 257/204 |
| 2015/0137224 | A1 | 5/2015 | Meiser et al. |
| 2015/0137307 | A1* | 5/2015 | Stuber ................... H01L 23/552 |
| | | | 257/503 |
| 2015/0347659 | A1 | 12/2015 | Chiang et al. |
| 2016/0043083 | A1 | 2/2016 | Kawa et al. |
| 2016/0093629 | A1 | 3/2016 | Wang |
| 2016/0197069 | A1 | 7/2016 | Morrow et al. |
| 2016/0307996 | A1 | 10/2016 | Meiser et al. |
| 2017/0352650 | A1* | 12/2017 | Azmat ............. H01L 27/11807 |
| 2017/0373064 | A1 | 12/2017 | Chang et al. |

OTHER PUBLICATIONS

International Search Report and Written Opinion for International Patent Application PCT/US2016/068564, dated Aug. 28, 2017.
International Preliminary Report on Patentability from PCT/US2016/065423 dated Jun. 20, 2019, 8 pgs.

* cited by examiner

INTEGRATED CIRCUIT DEVICE WITH CRENELLATED METAL TRACE LAYOUT

CLAIM OF PRIORITY

This Application is a National Stage Entry of, and claims priority to, PCT Application No. PCT/US2016/065423, filed on Dec. 7, 2016 and titled "INTEGRATED CIRCUIT DEVICE WITH CRENELLATED METAL TRACE LAYOUT", which is incorporated by reference in its entirety for all purposes.

BACKGROUND

Integrated circuit (IC) designs typically entail many device cells, which may be coupled into functional blocks to achieve a desired logic. A device cell may be standardized for a given fabrication technology and the standard cell added to a library. An exemplary elementary device cell is an inverter, having one input and one output. Many standard inverter cells may be designed, for example to span a range of functional metrics, such as drive current. Another example of an elementary device cell is a buffer. Many standard buffer cell designs may be similarly included as part of a parameterized cell library. Higher-level functional blocks, such as a latch may be constructed by coupling together the inputs and outputs of more basic standard device cells. These functional blocks may then be placed in a hierarchical cell library to further abstract circuit design from the device fabrication process. A well-developed standard cell library is important to the successful release of a new microelectronic fabrication process technology, providing circuit designers with access to various validated building blocks from which their circuit designs may be created without troubling each designer with atomic cell-level architecture that is highly-dependent on the process technology.

The designer of standard cells is tasked with architecting the layout of each cell for a given fabrication process. FIG. 1A is a plan view of an exemplary device cell layout that might be designed for a conventional 2D transistor fabrication process technology. As shown, device cell 101 occupies a footprint in the x-y dimensions with a perimeter boundary denoted by dashed line. Cell 101 may be any arbitrary device cell included as a standard cell in a cell library. Cell 101 includes a plurality of gate traces (a.k.a. "stripes" or "tracks") 150 having substantially parallel longitudinal lengths extending in a first direction (e.g., y-dimension). Each gate track 150 may function as a gate terminal for an exemplary field-effect transistor (FET). Gate tracks 150 are associated with some nominal gate pitch that is a function of the gate trace transverse critical dimension (CD), for example in the x-dimension, and a function of the spacing between adjacent gate tracks. In the example shown, there are three center gate tracks and half a gate track at opposite edges of cell 101. One or more of gate track 150 may be dummy (non-functional) gates. A standard cell of a given size in the x-dimension may include more or fewer gate tracks 150 than are illustrated in FIG. 1A.

Cell 101 further includes a plurality of interconnect traces, stripes or tracks 160 having substantially parallel longitudinal lengths extending in a second direction (e.g., x-dimension) orthogonal to gate tracks 150. Interconnect tracks 160 may be considered a first interconnect level in a stack of conductor levels fabricated over a transistor, and in FIG. 1A are assigned the designation "M0" ("metal zero"). Interconnect tracks 160 are associated with some nominal M0 pitch that is a function of the transverse $CD_{M0}$, for example in the y-dimension, and a function of the spacing $S_{M0}$ between adjacent M0 tracks. In some embodiments, a first M0 interconnect track 160 electrically couples to a source terminal of the exemplary FET, while a second M0 interconnect track 160 electrically couples to a drain terminal of the exemplary FET. A M0 track 160 may cross over a gate track 150 with one or more inter-level dielectric (ILD) material (not depicted) disposed there between for electrical insulation. A standard cell of a given size in the yx-dimension may include more or fewer M0 tracks 160 than are illustrated in FIG. 1A.

Cell 101 further includes a plurality of front-side interconnect traces, stripes or tracks 170 having substantially parallel longitudinal lengths extending in the first direction (e.g., y-dimension) parallel to gate tracks 150 (orthogonal to M0 interconnect tracks 160). Interconnect tracks 170 may be considered a second interconnect level fabricated on a front side of device cell 101, and in FIG. 1A are assigned the designation "M1" ("metal one"). Interconnect tracks 170 are associated with some nominal pitch $P_{M1}$ that is a function of the transverse CD, for example in the x-dimension, and a function of the spacing between adjacent M1 tracks. A M1 track 170 may cross over a M0 track 160 with one or more ILD material (not depicted) disposed there between for electrical insulation. Electrical interconnection between a M1 track 170 and a M0 track 160 is provided by a via V0 ("via zero"). Five V0 vias are illustrated for the exemplary cell 101. A standard cell of a given size in the x-dimension may include more or fewer interconnect tracks 170 than are illustrated in FIG. 1A.

Notably, each M1 track 170 ends within the confines of cell 101. Hence, while each M1 track 170 extends over five M0 tracks 160 within cell 101, each M1 track 170 has a first end at an edge of M0 track 105 and a second end at an edge of M0 track 110. The perimeter of cell 101 bifurcates M0 tracks 105, 110 such that when cell 101 is arrayed with other cells having a similar standard termination of the M1 tracks 170, the end-to-end spacing between each M1 track is at least equal to $CD_{M0}$. With such a design, the standard cell designer may ensure all circuit designs employing the standard cell will comply with a process technology's minimum M1 end-to-end spacing specification. For example, FIG. 1B is a plan view illustrating the device cell 101A surrounded by four nearest neighboring cells 101B, 101C, 101D, and 101E that might result when multiple cells are grouped into a functional IC block. Each cell 101A-101E may be any standard cell, shown for example as having different V0 counts and layouts. Cells 101A-101E may be modified as needed for their interconnection, for example by M0, M1, or a higher level route. Absent such interconnection, with each cell 101A-101E sharing the M1 layout introduced in FIG. 1A, the ½ M0 tracks 105, 110 associated with each cell ensure an end-to-end spacing of M1 in adjacent cells is at least equal to $CD_{M0}$. FIG. 1A also illustrates how any V0 placed within a cell will have a V0-to-M1 end overlap at least equal to the M0 track spacing $S_{M0}$. FIG. 1B also illustrates how the symmetric M1 track layout illustrated in FIG. 1A is independent of which boundary edge adjacent cells share.

Three-dimensional (3D) scaling is now of considerable interest as another avenue of increasing overall device density and IC performance. 3D architectures may represent a paradigm shift in IC process technology. Standard cell libraries may undergo dramatic revision between process generations when a paradigm shift occurs in fabrication technology. Cell layouts that best leverage a given 3D architecture are therefore commercially advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
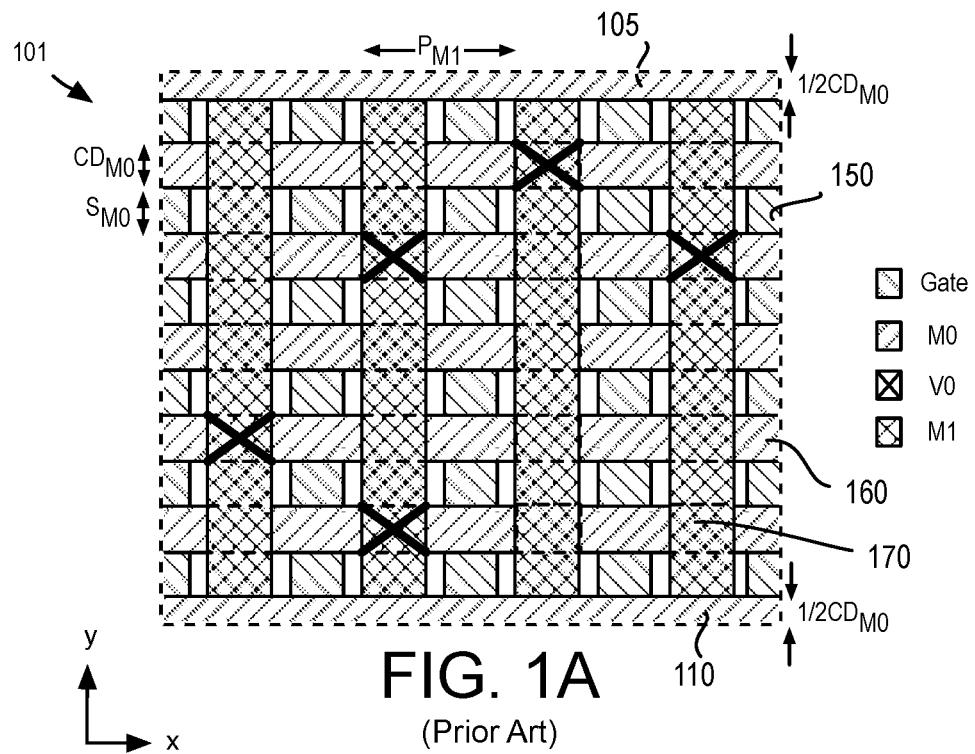
FIG. 1A is a plan view of an exemplary device cell layout in conformance with a 2D transistor fabrication process technology.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

IC device cell layouts, transistor structures, and fabrication techniques employing back-side interconnect routing are described herein. In some exemplary embodiments, a back side of device structures is revealed. A "back-side reveal" or simply "BSR", of a device structure may entail wafer-level back-side processing. In contrast to a conventional TSV-type technology, a back-side reveal as described herein may be performed at the density of transistor cells, and even within sub-regions of a single transistor cell. Furthermore, such back-side reveals may be performed to remove substantially all of a donor substrate upon which a device layer was disposed during front-side device processing. A microns-deep TSV becomes unnecessary with the thickness of semiconductor in the device cells following back-side reveal potentially being only tens or hundreds of nanometers. Notably however, a BSR fabrication process is not required to leverage all advantages of the interconnect trace routing described herein. For example, the crenellated interconnect trace routing described herein may be utilized with other back-side interconnect implementations. Indeed, some of the advantages of the crenellated interconnect trace routing described herein may be had even in the absence of back-side device interconnection. Cell layout embodiments described here are applicable to both planar and non-planar FET technologies. Non-planar FETs have semiconductor channel regions that include a sidewall through which a gate is electrically (e.g., capacitively) coupled. Exemplary non-planar transistors include multi-gate FinFETs, such as double-gate and tri-gate transistors, as well as wrap-around (gate all-around) transistors, such as nanoribbon or nanowire transistors.

The back-side reveal techniques described herein may enable a paradigm shift from "bottom-up" device fabrication to "center-out" fabrication, where the "center" is any layer that is employed in front-side fabrication, revealed from the back side, and again employed in back-side fabrication. In some embodiments, the back-side processing entails transistor-level back-side interconnect routing. For example, one or more terminal of a transistor may be interconnected to other nodes of an IC by one or more trace fabricated on the back side of the transistor. As such, for a given 3D device cell the number of front-side interconnect traces may be reduced. For example, in some embodiments where transistor source terminals are interconnected on the back side of a 3D device cell, the power supply rail may be removed from the front-side interconnect trace count, leaving only traces dedicated to routing signal inputs and outputs. This relocation of a transistor terminal interconnection need not directly impact the area (footprint) of a standard cell that may otherwise be limited for example by the area of the transistor(s). Hence, where transistor geometries remain static, the footprint of a standard cell may remain the same between a 2D and 3D device cell.

Figure 2A:
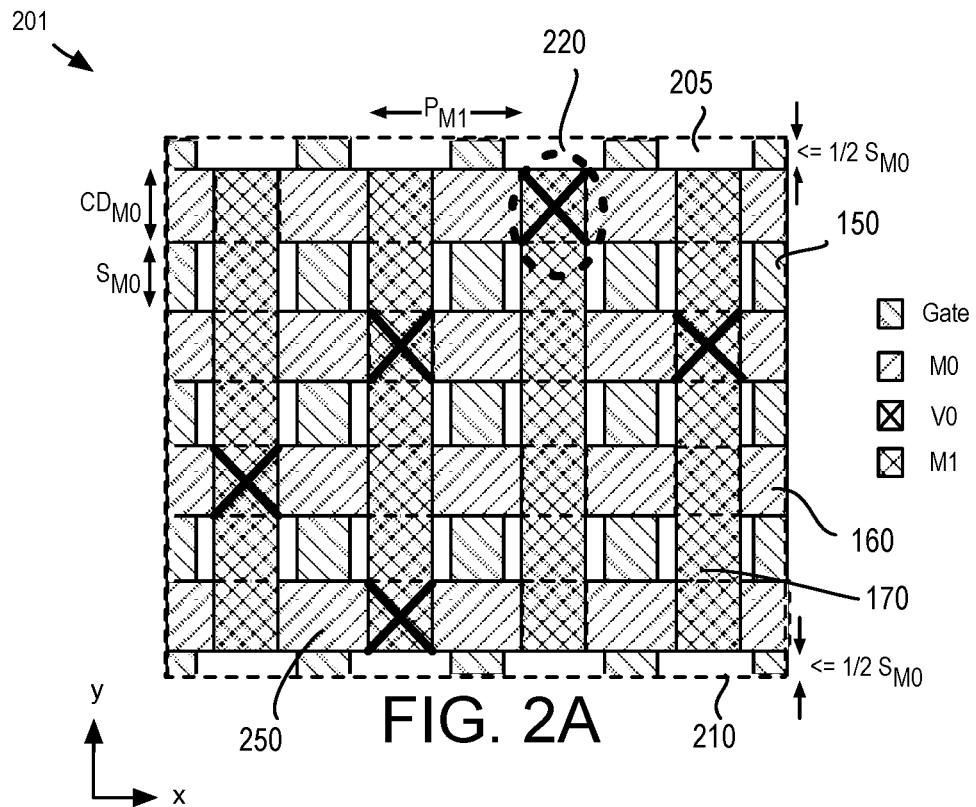
FIG. 2A is a plan view of an exemplary device cell layout that may be employed in a 3D transistor fabrication process technology, in accordance with some embodiments.
Figure 2B:
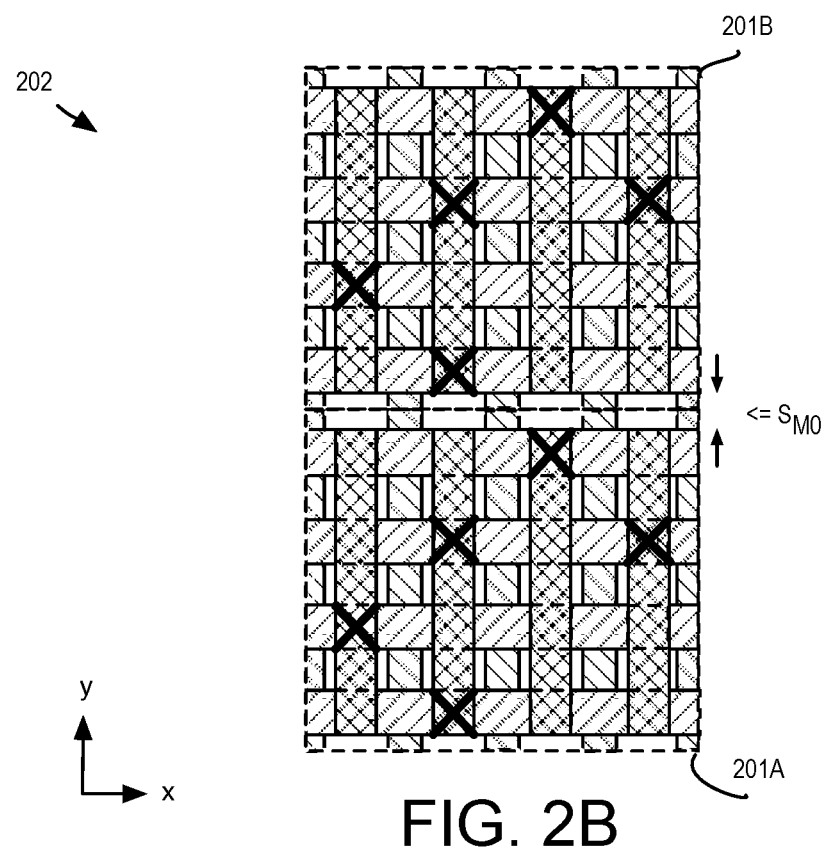
FIG. 2B is a plan view illustrating the device cell layout shown in FIG. 2A arrayed over an area of a fabrication substrate.

FIG. 2A is a plan view of an exemplary device cell front-side layout that may be employed in a 3D transistor fabrication process technology, in accordance with a non-crenellated embodiment. As shown, cell 201 includes gate tracks 150 extending to opposite cell boundaries and substantially as described above in the context of cell 101. Cell 201 however includes one fewer M0 tracks 160 than is present in cell 101. This reduction may, for example, be a result of relocating one of the five M0 tracks 160 of cell 101 to the back-side of cell 201. Assuming the footprint of cell 201 is substantially the same as that of cell 101, the pitch of the M0 tracks 160 in cell may be advantageously relaxed relative to that of cell 101. For example, $CD_{M0}$ may be increased within the constraint that the M0 tracks are still to provide connections to a transistor (e.g., drain) terminal. Dimensions of the five exemplary V0 vias may therefore also be increased relative to those employed in cell 101, advantageously reducing the complexity of the M0 and/or V0 patterning process and/or improving device parametrics (e.g., lower parasitics). M1 tracks 170 are again terminated within cell 201. However, because of the relaxation in M0 track layout, terminating M1 tracks at a M0 track as in the layout of cell 101 would increase the footprint of cell 201 relative to that of cell 101, or would necessitate an intervening M0 track of smaller CD or spacing, which could negate many of the advantages of relaxing M0 track dimensions elsewhere within cell 201. The layout of cell 201 therefore ends M1 tracks 170 at the edges of the two outside M0 tracks 160, accommodating a reduction of M0 tracks from an odd number of M0 tracks in cell 101 to an even number of M0 tracks in cell 201. A half M0 space ($\frac{1}{2}S_{M0}$) is included in cell 201, and when arrayed with adjacent cells (e.g., as illustrated in FIG. 2B), M1 tracks 170 have an end-to-end spacing between cells 201A and 201B that is ~$S_{M0}$. One limitation of the M1 track layout in cell 201 is that $S_{M0}$ may represent a challenging end-to-end spacing for the M1 patterning process. Also, noting that cell 201 includes the five exemplary V0 connections introduced in cell 101, another limitation in the layout of cell 201 is highlighted by the dashed line circling V0 220. Specifically, there is very little overlap between V0 220 and the end of the M1 track 170 that is terminated on the M0 track upon which V0 220 lands. This minimal overlap may result in a M0-M1 open or other process marginality.

In accordance with other embodiments herein, a device cell layout includes a crenellated front-side conductive trace layout. A crenellated layout laterally staggers at least one end of a first trace from that of a second, adjacent trace. In accordance with some exemplary embodiments, a pair of adjacent M1 tracks are crenellated so as to have at least one of their respective ends laterally staggered from each other by at least the dimension of an intervening M0 track. As described further below, the crenellated trace layout addresses limitations of the layout in cell 201. FIGS. 3A, 3B, 3C, and 3D are plan views illustrating exemplary device cells employing a crenellated conductive (metal) trace layout that may be utilized, for example in a 3D transistor fabrication process technology, in accordance with some embodiments.

Figure 3A:
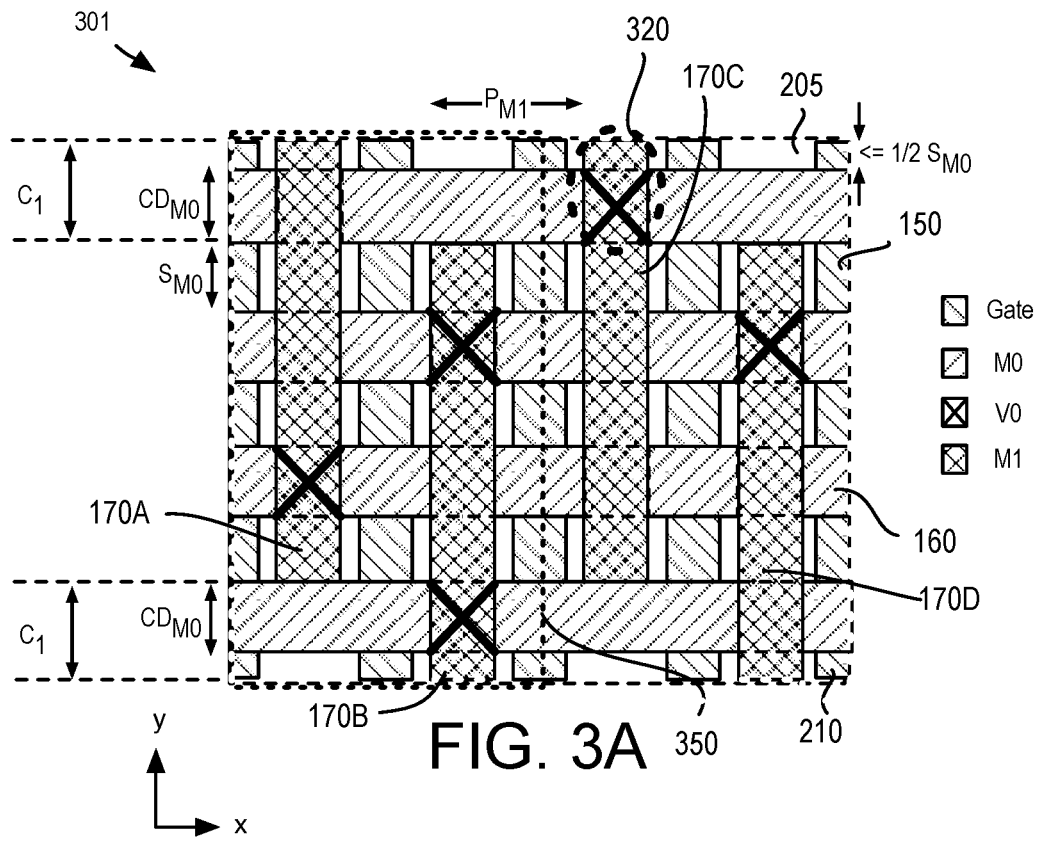
FIGS. 3A, 3B, 3C, and 3D are plan views illustrating exemplary device cells employing a crenellated metal trace layout that may be utilized in a 3D transistor fabrication process technology, in accordance with some embodiments.

FIG. 3A illustrates a plan view of a front side of a device cell 301. Cell 301 shares some of the layout attributes of cell 201, such as the plurality of gate tracks 150 substantially as described above. Like cell 201, cell 301 only includes an even number (e.g., 4) M0 tracks 160, which may be associated with a 3D cell architecture that includes a transistor terminal interconnection on the back-side of cell 301 (not depicted). Assuming the footprint of cell 301 is substantially the same as that of cell 201, the pitch of the M0 tracks 160 in cell 301 may again be advantageously relaxed relative to that of cell 101. For example, $CD_{M0}$ may be increased within the constraint that M0 tracks 160 are still to allow connections to a transistor (e.g., drain) terminal. V0 dimensions may therefore also be increased relative to those employed in cell 101, advantageously reducing the complexity of the M0 and/or V0 patterning process and/or improving device parametrics (e.g., lower parasitics). In cell 301, M1 tracks 170 are crenellated with an end of a first M1 track 170A laterally offset (e.g., in the y-dimension) from a corresponding end of adjacent M1 track 170B. In this example, the ends of M1 tracks 170A and 170B nearest a first (e.g., bottom) edge of the cell boundary are offset from each other by a crenellation distance $C_1$ that is at least equal to $CD_{M0}$ of an intervening M0 track 160. In the illustrated embodiment, $C_1$ is equal to $CD_{M0}$ summed with ½$S_{M0}$. As such, where any V0 location is allowed, the M1-V0 overlap is increased relative to that for the layout in cell 201. For example, the end of M1 track 170C overlaps V0 320 by at least ½ of $S_{M0}$.

In some further embodiments, crenellation of interconnect traces further comprises laterally offsetting both ends of a first metal track from corresponding ends of a second, adjacent metal track. As further shown in FIG. 3A for example, the ends of M1 tracks 170A and 170B nearest a second (e.g., top) edge of the cell boundary are offset by the same amount (crenellation distance $C_1$) as the offset between the opposite ends of M1 tracks 170A and 170B. While the illustrated example shows crenellation for M1 tracks 170 having longitudinal lengths extending in the y-dimension, crenellation may instead entail a lateral offset in the x-dimension for M1 tracks having longitudinal lengths that extend in the orthogonal, x-dimension.

In some embodiments, a pair of crenellated interconnect traces includes one trace that intersects a first cell boundary while the other trace of the pair does not. The trace intersecting the first cell boundary can have continuity with a trace at the same interconnect level in the adjacent cell sharing that boundary without further modification to the standard cell, while the trace that does not intersect that cell boundary would need to be supplemented at the function block level to make an electrical connection to that same adjacent cell. In some such embodiments, a pair of crenellated interconnect traces includes one trace that intersects a first cell boundary while the other trace of the pair intersects a second cell boundary, opposite the first cell boundary. Each trace in the pair intersects only one of the first and second cell boundaries. In FIG. 3A for example, M1 track 170A intersects the top cell boundary, but does not interest the bottom cell boundary. M1 track 170B intersects the bottom cell boundary, but does not intersect the top cell boundary. In the exemplary cell 301 where the unit cell 350 is repeated twice, the M1 tracks 170A-170D alternate between a "top outside-bottom inside" track and a "top inside-bottom outside" track layout. Such a crenellated layout pattern may be repeated for any odd or even number of M1 tracks included a given standard cell and defines a phase of the crenellation within the cell.

Noting the M1 track layout in cell 301 is asymmetrical and cannot be superimposed on its mirror image, in some further embodiments, standard cells with crenellated traces may entail "left handed" and "right handed," or "complementary" variants to accommodate cell chirality resulting from the phase of track crenellation. While cell 301 has a crenellation with a first phase where the first track (e.g., M1 track 170A) is a "top outside-bottom inside" track, cell 302 shown in FIG. 3B has the complementary phase where the first track (e.g., M1 track 170B) is a "top inside-bottom outside" track. Like cell 301, cell 302 only includes four M0 tracks 160, indicative of a transistor terminal connection on the back-side of cell 302. Assuming the footprint of cell 302 is substantially the same as that of cell 301, the pitch of the M0 tracks 160 in cell 302 may be the same as that of cell 301. In cell 302, M1 tracks 170 are crenellated with an end of a first M1 track 170A laterally offset (e.g., in the y-dimension) from a corresponding end of adjacent M1 track 170B. In this example, the ends of M1 tracks 170A and 170B nearest a first (e.g., bottom) edge of the cell boundary are offset from each other again by crenellation distance $C_1$ that is at least equal to $CD_{M0}$ of an intervening M0 track 160. In the illustrated embodiment, $C_1$ is equal to $CD_{M0}$ summed with ½ of $S_{M0}$. As such, where any V0 location is allowed, the M1-V0 overlap in cell 302 is the same as in cell 301.

Figure 3B:
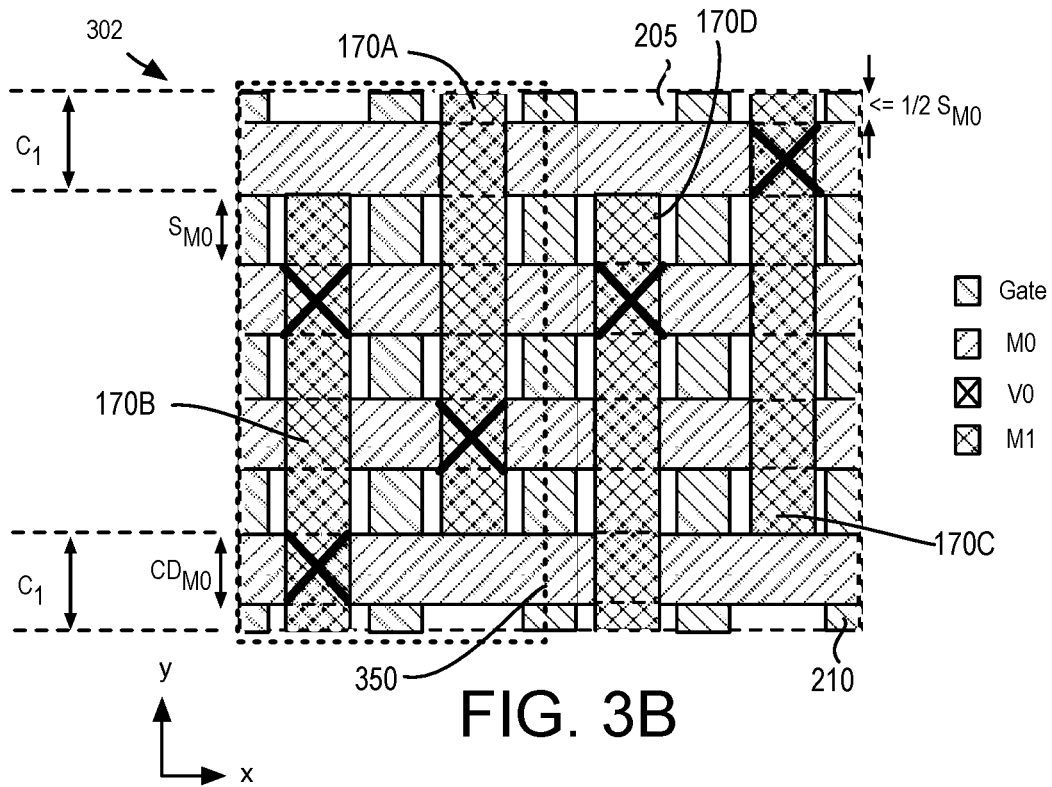

In cell 302, both ends of metal track 170A are offset from corresponding ends of adjacent metal track 170B. Opposite ends of M1 tracks 170A and 170B are offset by the same amount (crenellation distance $C_1$). While the illustrated example again shows crenellation for M1 tracks 170 having longitudinal lengths extending in the y-dimension, crenellation may instead entail a lateral offset in the x-dimension for M1 tracks having longitudinal lengths in the x-dimension. As for cell 301, a pair of crenellated interconnect traces includes one trace that intersects a first cell boundary while the adjacent trace of the pair does not. Each trace 170A, 170B only intersects one of two opposite cell boundaries. In FIG. 3B, M1 first M1 track 170B intersects the bottom cell boundary, but does not interest the top cell boundary. Second M1 track 170A intersects the top cell boundary, but does not intersect the bottom cell boundary. In the exemplary cell 302 where the unit cell 350 is again repeated twice, the M1 tracks 170A-170D alternate between a "top inside-bottom outside" track and a "top outside-bottom inside" track layout. Such a crenellated layout pattern may be repeated for any odd or even number of M1 tracks included a given standard cell.

Figure 3C:
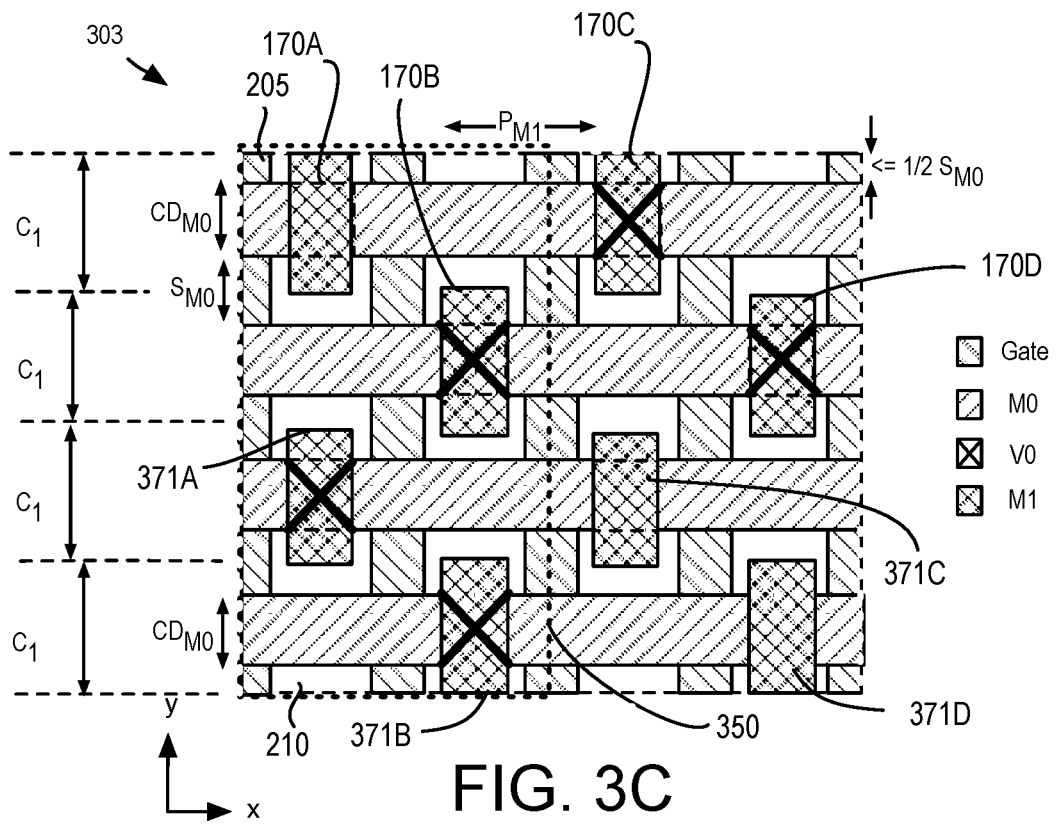
Figure 3D:
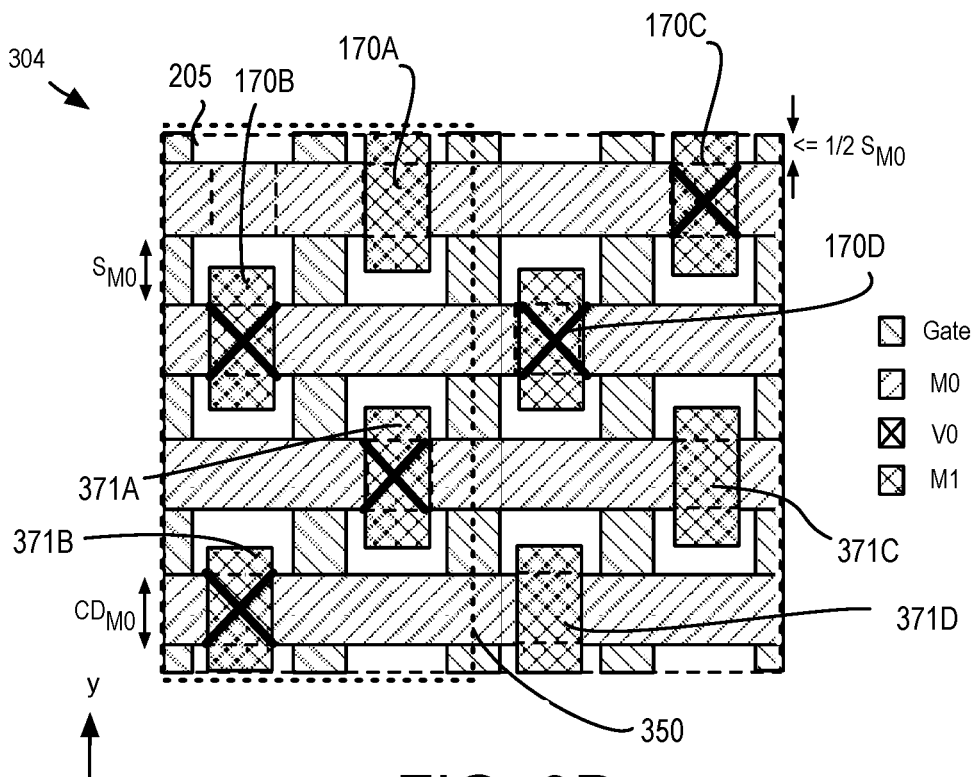

Notably, crenellated traces may have any longitudinal length relative to the standard cell. In the cells 301 and 302, each crenellated M1 track within the cell spans more than one M0 track. For other embodiments however, a crenellated track may be significantly shorter, for example intersecting only one orthogonal track where a via may be located. FIG. 3C, for example, is a plan view illustrating a cell 303 including another illustrative crenellated layout. Assuming the footprint of cell 303 is substantially the same as that of cell 301, the pitch of the M0 tracks 160 in cell 303 may be the same as that of cell 301. In cell 303, M1 tracks 170 are crenellated with an end of a first M1 track 170A laterally offset (e.g., in the y-dimension) from a corresponding end of adjacent M1 track 170B. In this example, the ends of M1 tracks 170A and 170B nearest a first (e.g., top) edge of the cell boundary are offset from each other by crenellation distance $C_1$ that is at least equal to $CD_{M0}$ of an intervening M0 track 160. In the illustrated embodiment $C_1$ is equal to $CD_{M0}$ summed with $S_{M0}$. In cell 303, M1 tracks 371 are also crenellated. An end of first M1 track 371A is laterally offset (e.g., in the y-dimension) from a corresponding end of adjacent M1 track 371B. In this example, the ends of M1 tracks 371A and 371B nearest a second (e.g., bottom) edge of the cell boundary are again offset from each other by distance $C_1$. M1 tracks 170A and 371A have an end-to-end spacing that is equal to the crenellation offset, for example again being separated by the distance $C_1$ that is equal to $CD_{M0}$ summed with $S_{M0}$. Where a cell includes more than one pair of crenellated traces, the crenellated layout may be propagated over any odd or even number of adjacent traces. In cell 303, for example, the unit cell 350 is repeated twice such that M1 tracks 170A, 170B, 170C, and 170D are all crenellated by distance $C_1$, as are M1 tracks 371A, 371B, 371C, and 171D. FIG. 3D is a plan view further illustrating a crenellated layout in cell 304 that is complementary to that of cell 303. The crenellation phase in cell 304 is 180° of that in cell 303.

Complementary crenellated cells 301, 302, 303, 304 may be combined in any manner. For complementarily crenellated layouts, the M1 track location that allows a V0 connection to a given M0 track 160 may vary. For example, in cells 301 and 302, only half of the M1 tracks 170A-170D support a V0 location to either of the two outer M0 tracks 160 without a block-level extension to a M1 track. However, the netlists associated with cell 301 necessitating the five V0 vias, are also satisfied by the five V0 vias as relocated in cell 302 to accommodate the trace crenellation. The layout of the five V0 vias in cells 303 and 304 satisfy the netlists associated with cell 301, and so are also functionally equivalent standard cell layouts. With standard cells that are complementary in layout but satisfying equivalent netlists, arrays of the standard cells designed at the block-level can maintain the desirable attributes of the standard cell (e.g., the V0-M0 track overlap and M1 track end-to-end spacing) while maintaining a good fill ratio.

Figure 1B:
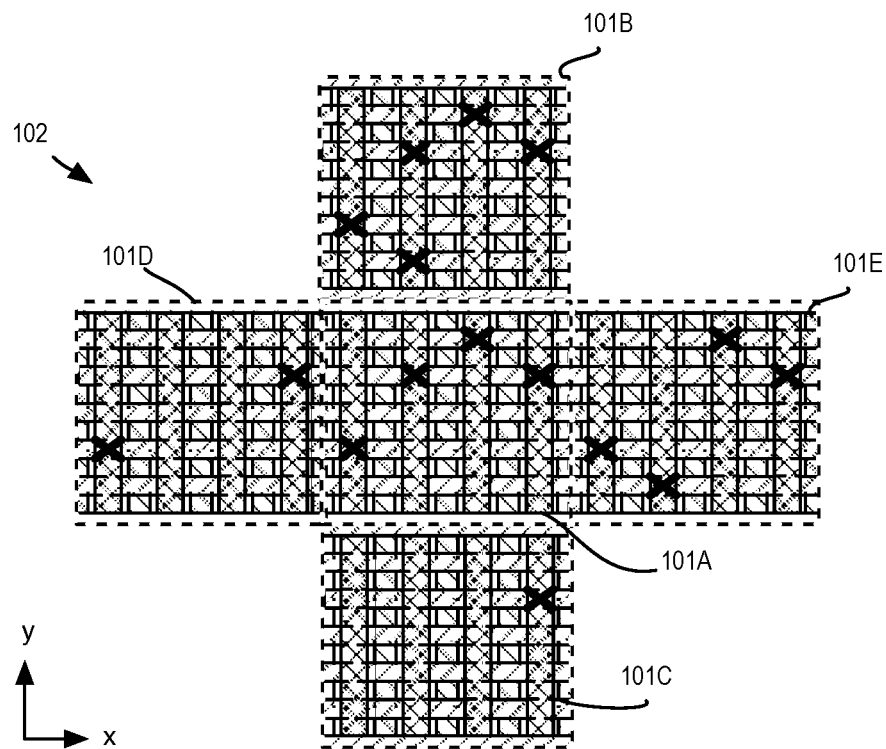
FIG. 1B is a plan view illustrating the device cell layout shown in FIG. 1A array over an area of a fabrication substrate.
Figure 4A:
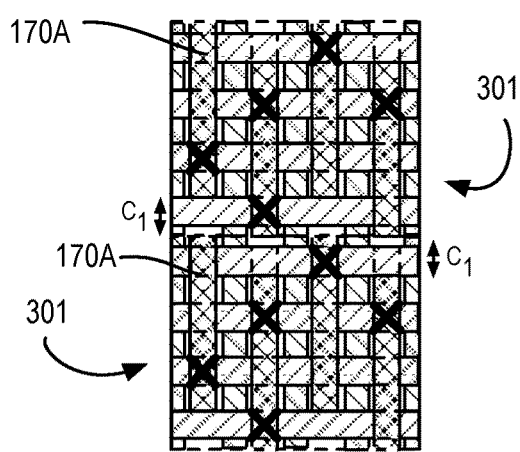
FIGS. 4A, 4B, 5A, 5B, 6A, and 6B are plan views illustrating the device cell layouts shown in FIGS. 3A and 3B arrayed over an area of a fabrication substrate, in accordance with some embodiments.
Figure 4B:
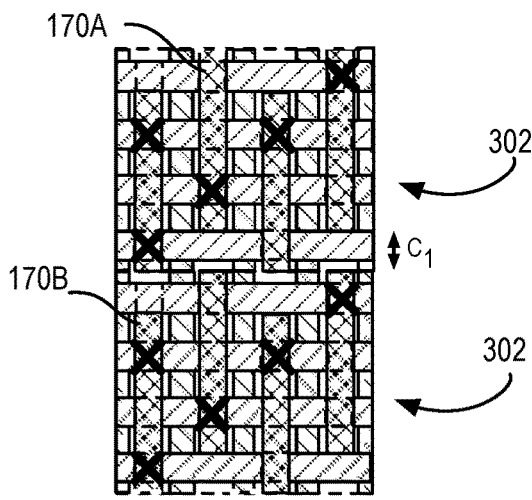
Figure 5A:
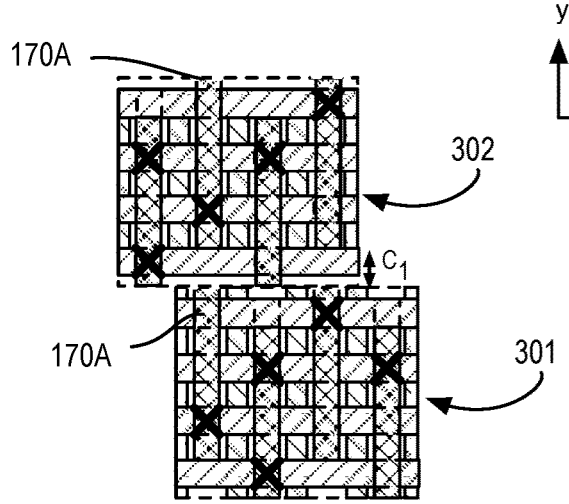
Figure 5B:
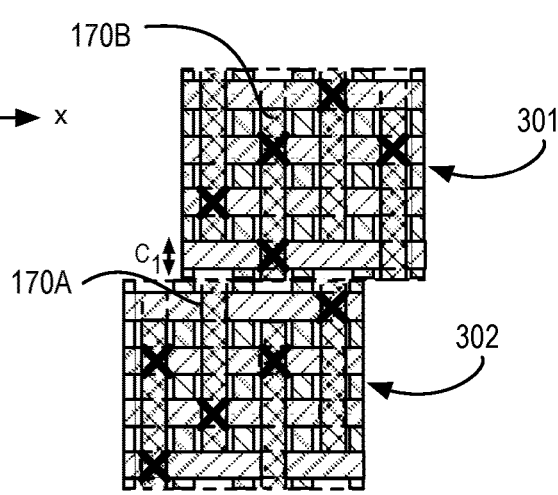
Figure 6A:
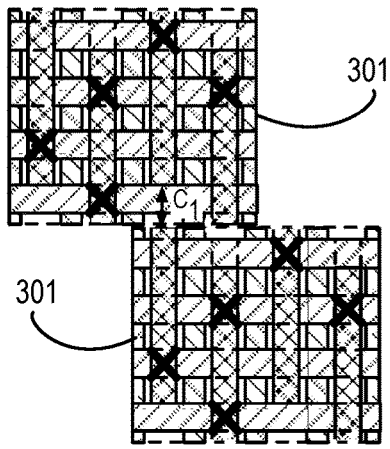
Figure 6B:
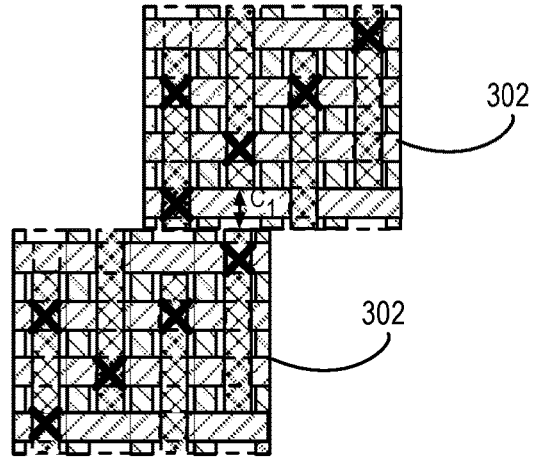

FIGS. 4A-B, 5A-B, and 6A-B are plan views illustrating the cell layouts shown in FIGS. 3A and 3B arrayed over an area of a fabrication substrate, in accordance with some block-level embodiments. Although not illustrated, similar arrays may be assembled from cells 303 and 304. Likewise, cells 301, 302, 303, 304 may be mixed together to form any desired functional IC block having a crenellated trace layout.

Where no inter-cell M1 track connections are desired, cells having the same crenellation phase may be positioned adjacent to each other, for example to share a top/bottom cell edges when the tracks are crenellated in the y-dimension. The cells should also be aligned in the x-dimension to have their tracks aligned. For example, FIG. 4A illustrates two cells 301 sharing a top/bottom cell edges with all tracks aligned in the x-dimension. Because M1 tracks 170 crenellate in phase, and are aligned in the x-dimension, the M1 tracks that extend to the cell top edge in one cell 301 do not intersect any of the M1 tracks that extend to the bottom edge in the adjacent cell 301. M1 track end-to-end spacing between adjacent cells 301 is maintained at distance C1. Any M1 track interconnection between the two aligned cells 301 may be designed at the block-level with routing through another metal interconnect level (e.g., M2 or higher), or through a M1 track patch or appendix that joins together aligned tracks. FIG. 4B illustrates two cells 302 sharing a top/bottom cell edges. Here again, because M1 tracks 170 crenellate in the y-dimension in phase, and are aligned in the x-dimension, the M1 tracks that extend to the cell top edge in one cell 302 do not intersect the M1 tracks that extend to the bottom edge in the adjacent cell 302. Notably, arraying the cells 301 or cells 302 in the manner shown in FIG. 4A, 4B provides essentially the same M1 inter-cell connections (or lack thereof) as the layout shown in FIG. 1B, while eliminating two M0 tracks.

Where two standard cells are adjacent but laterally offset from each other (e.g., sharing top/bottom cell edges when the tracks are crenellated in the y-dimension), cells having complementary crenellation phases may be selected to maintain a desired M1 track end-to-end spacing across the shared boundary of the cells. For example, FIG. 5A illustrates a cell 302 sharing a bottom cell edge with a top cell edge of a cell 301. Cell 302 is indexed laterally from cell 301 by one M1 track pitch in a first direction so that only three of the M1 tracks in each cell are aligned in the x-dimension. Because they crenellate 180° out of phase, M1 track 170A that extends to the top edge of cell 301 maintains the C1 spacing to M1 track 170A that extends to the bottom edge in the adjacent cell 302. As further shown in FIG. 5B, cell 301 sharing a bottom cell edge with a top cell edge of a cell 302 is indexed laterally in a second direction by one M1 track pitch so that only three of the M1 tracks in each cell are aligned in the x-dimension. Those aligned M1 tracks again maintain the C1 spacing. Where two adjacent cells are laterally offset by two M1 track pitches, the same standard cell layout may be employed, as further illustrated in FIGS. 6A and 6B for two cells 301 and two cells 302, respectively. Likewise, where two adjacent cells are laterally offset by three M1 track pitches, complementary standard cell layouts may be employed. Hence, assuming cells 301 and 302 are netlist equivalents, any of combination of these cells may be employed to replicate the netlist with different block-level layouts. Similarly, a first or second version of a first standard cell may be combined with either a first or second version of a second standard cell, as needed for a given block-level layout.

Figure 7A:
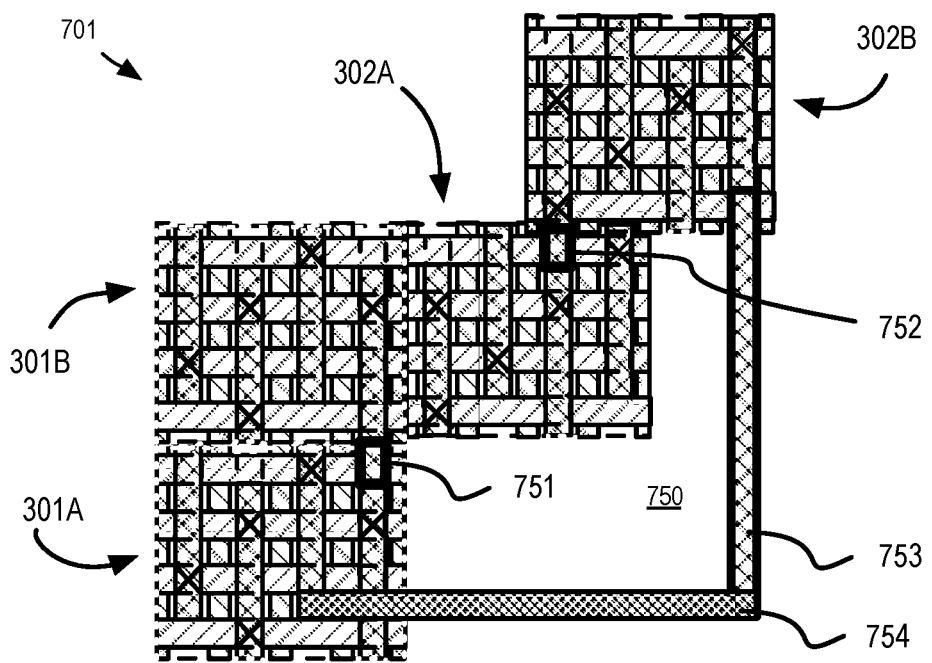
FIGS. 7A and 7B are plan views further illustrating block-level interconnection of device cells arrayed over an area of a fabrication substrate, in accordance with some embodiments.
Figure 7B:
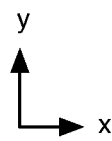
Figure 7B:
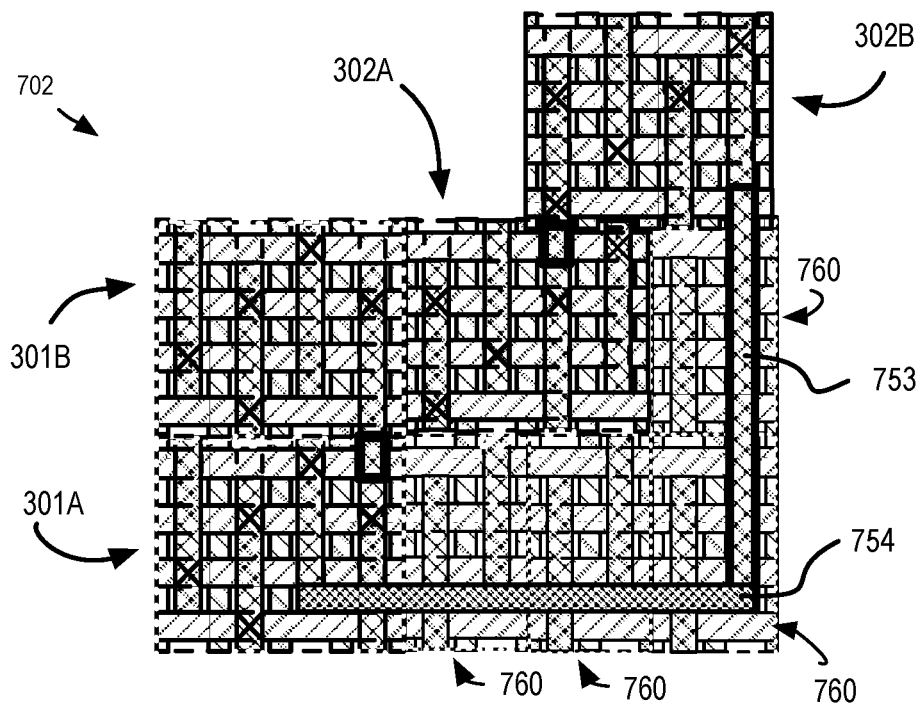

For cells with crenellated trace layouts that interconnected at the block-level, crenellated trace ends may still be present at edges of the functional block, and within fill cells. FIGS. 7A and 7B are plan views further illustrating interconnection of device cells 301 and 302 arrayed over an area of a fabrication substrate, in accordance with some embodiments. In FIG. 7A, an exemplary functional IC block 701 is shown to include a two interconnected cells 301A, 301B and two interconnected cells 302A, 302B. Crenellation of the M1 tracks in cells 301A, 301B is aligned, and M1 track spacing between the cells dictated by the crenellation offset. A M1 track patch 751 is employed in the block-level design to interconnect a M1 track of a cell 301A to adjacent cell 302A. Although drawn as a discrete bridge in FIG. 7A, as fabricated, M1 track patch 751 will be continuous with the remainder of the corresponding track in IC block 701. Such trace appendices reduce the rigidity of crenellated standard cell layouts within any given functional block, but will generally not eliminate all track crenellation. For example, the opposite ends of the M1 track joined by M1 track patch 751 remain crenellated from their nearest neighboring (adjacent) M1 tracks as there is no reason to add M1 track patches to extend these track ends beyond the offset positions associated with the crenellated cell layouts of cells 301A, 302A.

As further illustrated in FIG. 7A, cell 302B is interconnected to cells 302A by another M1 track patch 752. However, because of the distance between cell 302B and 301A, a further interconnection between these cells entails an upper-level track 754, which may be a M2 track for example. Upper-level track 754 has one end connected to a M1 track of cell 301A by a first via (e.g., V1), and a second end connected by a second via to a M1 track patch 753. M1 track patch 753 is extended to intersect a crenellated end of the fourth M1 track in cell 302B. As with M1 track patch 751, M1 track patches 752 and 753 disguise crenellation of one end of some M1 tracks in cell 302B. However, the opposite end of these M1 tracks remains offset from the neighboring track in a manner indicative of the crenellated layout of the standard cell. It is further noted that M1 track patch 753 is generally not fabricated in isolation as it is depicted in FIG. 7A. Rather, other functional integrated circuitry may occupy the region spanned by M1 track patch 753 and upper-level track 754. Alternatively, fill cells may occupy this region.

In accordance with some embodiments, a fill cell has a crenellated track layout at one or more interconnect levels. FIG. 7B illustrates an exemplary filled functional IC block 702, which includes IC block 701, as introduced above and redrawn in heavy line in FIG. 7B. Fill cells 760 surrounding IC block 701 are drawn in light line. Depending on layout efficiency (e.g., fill factor) of a given function block, fill cells may account for up to 30%, or more, of a block footprint. As shown, each fill cell 760 includes crenellated M1 tracks substantially as described above for cells 301, 302. Specifically, each fill cell 760 shares the layout of the atomic unit 350 introduced in FIG. 3A or FIG. 3B. M1 track patch 753 is provided, at least in part, by a M1 track in the fill cell that maintains the crenellated layout. While many M1 track patches may be employed in a given functional block layout, such patching is not ubiquitous within fill cells. Hence, fill cell layout may be highly indicative of track crenellation in accordance with embodiments described herein.

Figure 8A:
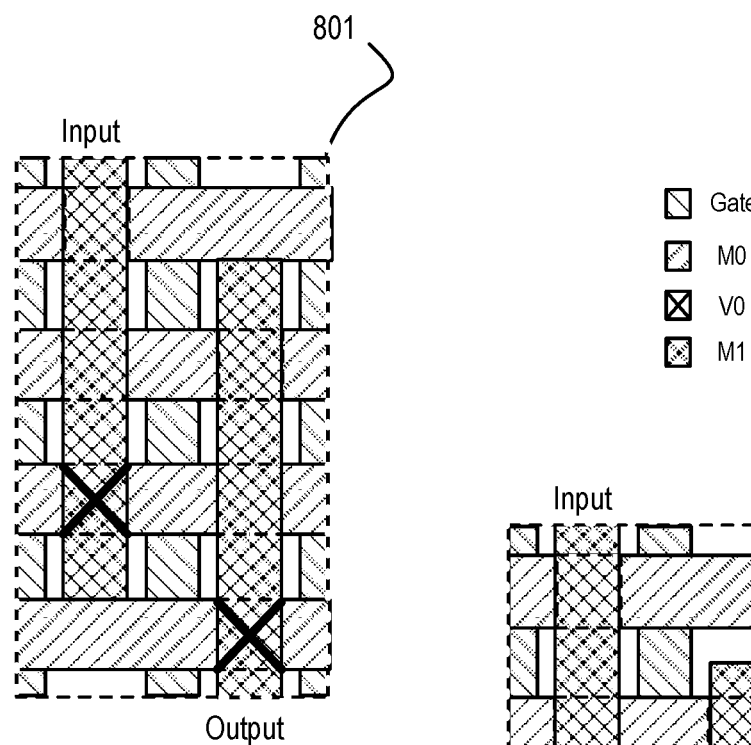
FIGS. 8A, 8B, and 8C illustrate exemplary inverter cell layouts employing a crenellated metal trace layout, in accordance with some embodiments.
Figure 8B:
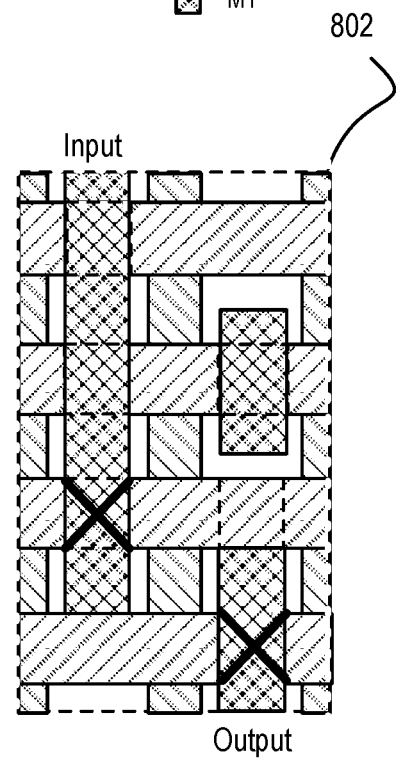
Figure 8C:
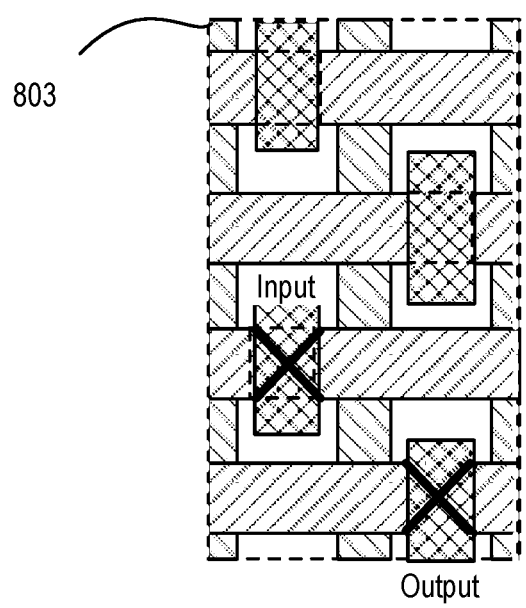

Although IC layout is subject to many constraints and myriad possibilities exist for all but the simplest cells, track crenellation within the scope of the embodiments herein will be evident in most, if not all, layouts. FIGS. 8A, 8B, and 8C illustrate exemplary inverter cell layouts employing a crenellated metal trace layout, in accordance with some embodiments. An inverter cell is a basic cell typically included in all standard cell libraries. While many inverter cell layouts may be included in a given library, for example to span a range of drive currents, inverter cell layouts in accordance with some embodiments herein will all share attributes of track crenellation. In FIG. 8A, for example, inverter cell 801 includes an input M1 track and an output M1 track. Ends of these two M1 tracks are crenellated in the manner described in depth elsewhere herein (e.g., FIG. 3A-3B). In FIG. 8B, inverter cell 802 includes an input M1 track substantially as in cell 801, while the output M1 track is shortened to intersect only one M0 track in support of one output V0. Ends of these M1 tracks are again crenellated in the manner described in depth elsewhere herein (e.g., FIG. 3A-3D). In FIG. 8C, inverter cell 803 includes an output M1 track substantially as in cell 802, while the input M1 track is also shortened to intersect only one M0 track in support of one input V0. Ends of these M1 tracks are again crenellated in the manner described in depth elsewhere herein (e.g., FIG. 3C-3D). Hence, in addition to a variety of inverter cells spanning a range of functional metric, a library may include a variety of inverter cells with differing layout crenellation (e.g., two different crenellation phases, and/or different trace lengths).

Figure 9:
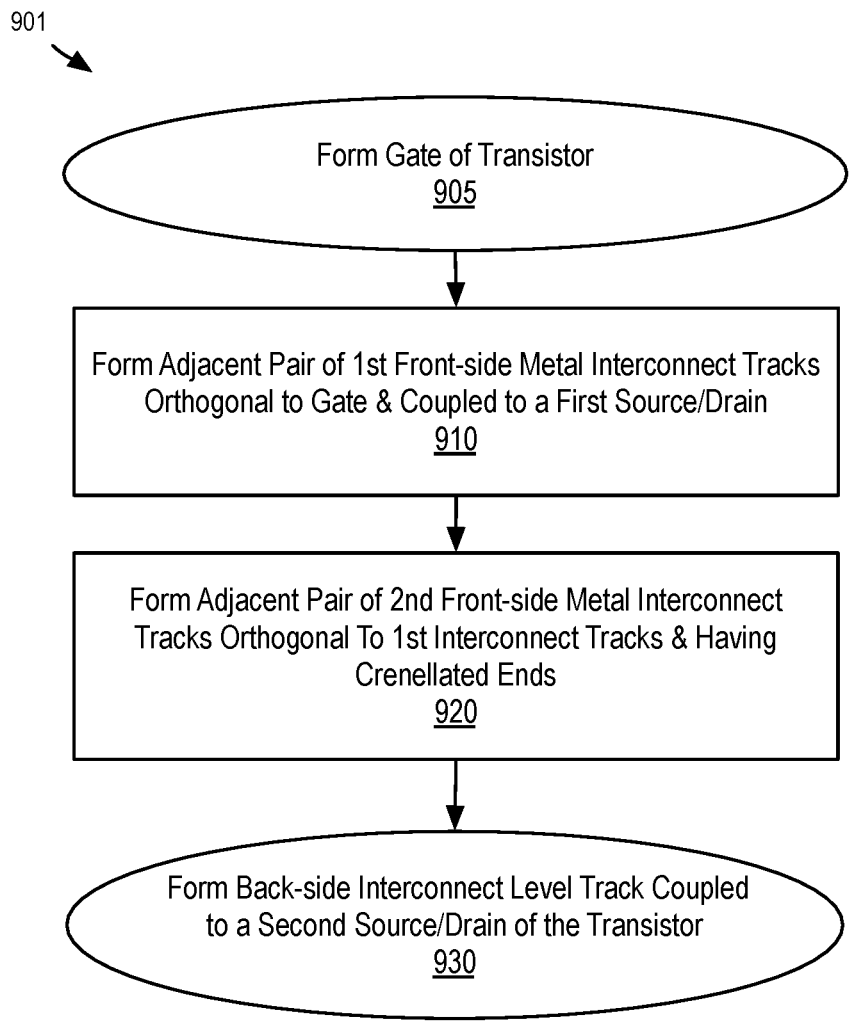
FIG. 9 is a flow diagram illustrating 3D fabrication of a device cell, in accordance with some embodiments.

With many architectural features of device cells having a crenellated track layout now described, discussion turns to exemplary methods for fabricating such device cells. FIG. 9 is a flow diagram illustrating 3D fabrication of a device cell, in accordance with some embodiments. In methods 901, a transistor gate electrode track or stripe is formed at operation 905. At operation 910, an adjacent pair of first front-side metal interconnect level tracks or stripes extending orthogonally to the gate electrode are formed. These front-side metal interconnect traces may be a first level of interconnect metal (e.g., M0), and each track may couple to one source/drain of a given transistor, for example. At operation 920, an adjacent pair of second front-side metal interconnect tracks or stripes extending orthogonally to the first metal interconnect tracks are formed in an overlying metal level (e.g., M1). These second front-side interconnect tracks are patterned to have crenellated ends. In some advantageous embodiments, the crenellation comprises an offset between adjacent ends that is at least equal to the CD of a first front-side metal trace. At operation 930, a back-side interconnect level track or stripe is coupled to another source/drain of a given transistor, completing interconnection of three transistor terminals. Any conventional processing may then be employed to complete a device that incorporates the device cells fabricated by methods 901.

Figure 10:
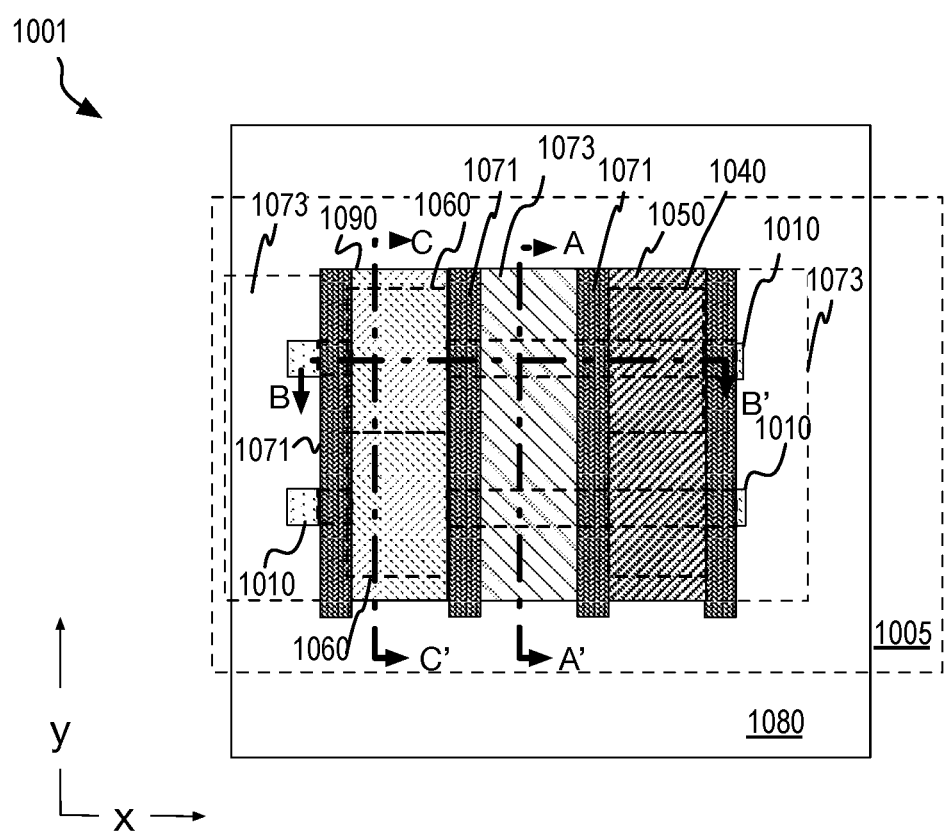
FIG. 10 is a plan view of a transistor cell fabricated with a 3D fabrication method, in accordance with some embodiments.

FIG. 10 is a plan view of a transistor cell 1001 fabricated with a 3D fabrication method, in accordance with some embodiments. Transistor ell 1001 may be included within any of the device cells described above (e.g., 301-304). Transistor cell 1001 includes a field effect FET with a source terminal, a drain terminal, and a gate terminal, in accordance with one illustrative embodiment. In some embodiments, the source and drain terminals include semiconductor having the same conductivity type. In other embodiments, the source and drain terminals include semiconductor having complementary conductivity types (e.g., as employed in a tunnel FET, or TFET). The FET may also include a heterojunction (i.e., HFET) and may also qualify as a high electron mobility transistor (HEMT), for example where the channel region comprises a III-V or III-N material. In FIG. 10, solid lines within the expanded view of transistor cell 1001 denote salient materials and/or features overlying other material or structural features denoted in dashed lines within a transistor cell stratum. Heavy dot-dashed lines in FIG. 10 denote planes A-A', B-B' and C-C' along which cross-sectional views are further provided in FIG. 11 A, B, C, where the letter in the figure number corresponds to the cross-sectional plane designated by that same letter.

As further shown in FIG. 10, FET cell 1001 is supported by an underlayer 1005 with semiconductor bodies 1010 that are embedded within a field isolation dielectric material 1080. In some embodiments, underlayer 1005 includes a carrier substrate. In some embodiments, an intervening layer (not depicted) separates underlayer 1005 from a carrier substrate. Transistor cell 1001 includes a gate electrode 1073 strapping over a channel region of each of a first and a second semiconductor body 1010. Although two semiconductor bodies 1010 are illustrated, a non-planar FET may include one or more such semiconductor bodies. The transistor channel region within semiconductor bodies 1010 may include one or more semiconductor region having any of the compositions described above that are suitable for a field effect transistor. Exemplary materials include, but are not limited to, group IV semiconductors (e.g., Si, Ge, SiGe), group III-V semiconductors (e.g., GaAs, InGaAs, InAs, InP), group III-N semiconductors (e.g., GaN, AlGaN, InGaN), oxide semiconductors, transition metal dichalcogenides (TMDCs), graphene, etc. In some advantageous embodiments, semiconductor bodies 210 are monocrystalline, but they may also be poly(nano)-crystalline or amorphous, with some examples being oxide semiconductors and other thin film transistor semiconductor.

Although only one gate electrode 1073 is illustrated in solid line as being part of a single logic transistor cell, an exemplary second gate electrode 1073 is drawn in dashed line as being associated with an adjacent transistor cell. Spacer dielectric 1071 laterally separates the second gate electrode from metallization 1050 and/or source/drain semiconductor 1040, 1060. While any gate stack materials known to be suitable for semiconductor bodies 1010 may be utilized, in some exemplary embodiments the gate stack includes a high-k dielectric material (with a bulk relative permittivity greater than 9) and a metal gate electrode having a work function suitable for semiconductor bodies 1010. Exemplary high-k materials include metal oxides, such as, but not limited to, $Al_2O_3$, $HfO_2$, and $HfAlO_x$. Silicates, such as, but not limited to $HfSiO_x$, or $TaSiO_x$ may also be suitable for some semiconductor body compositions (e.g., Si, Ge, SiGe, III-V). Gate electrode 273 may advantageously have a work function below 5 eV and may include an elemental metal layer, a metal alloy layer, or laminate structure of either or both. In some embodiments gate electrode 1073 is a metal nitride, such as TiN (e.g., 4.0-4.7 eV). The gate electrode may also comprise Al (e.g., TiAlN). Other alloy constituents may also be employed in a gate electrode, such as, but not limited to, C, Ta, W, Pt, and Sn.

As further illustrated in FIG. 10, source/drain metallization 1050 is disposed adjacent to gate electrode 1073 and also extends across semiconductor bodies 1010. In the illustrated embodiment, source/drain metallization 1050 is disposed on source/drain semiconductor 1040, which is further disposed in contact with semiconductor bodies 1010. Source/drain semiconductor 1040 may have n-type or p-type conductivity. Semiconductor bodies 1010 are shown in dashed line as extending under an electrically insulating spacer dielectric 1071 and intersecting source/drain semiconductor 1060. Semiconductor bodies 1010 may be bifurcated by source/drain semiconductor 1060. Source/drain semiconductor 1060 may have n-type or p-type conductivity. For some exemplary embodiments, both source/drain semiconductor 1040 and source/drain semiconductor 1060 have the same conductivity type (e.g., n-type for NMOS and p-type for PMOS). In alternative embodiments (e.g., for a tunneling FET), source/drain semiconductor 1040 has conductivity complementary to that of source/drain semiconductor 1060 (e.g., n-type source and p-type drain of a TFET). Source/drain semiconductor 1040, 1060 may be any semiconductor materials compatible with semiconductor bodies 1010, such as, but not limited to, group IV semiconductors (e.g., Si, Ge, SiGe), and/or group III-V semiconductors (e.g., InGaAs, InAs), and/or group III-N semiconductors (e.g., InGaN), and/or oxide semiconductors. In the illustrated embodiment, source/drain semiconductor 1040, 1060 form continuous stripes extending between semiconductor bodies 1010. As a function of spacing between semiconductor bodies 1010, source/drain semiconductor 1040 and/or 1020 may each comprise a discrete structure disposed on each semiconductor body 1010.

Spacer dielectric 1071 laterally separates gate electrode 1073 from source/drain metallization 1050 and/or source/drain semiconductor 1040, 1060. Spacer dielectric 1071 may be or any dielectric such as, but not limited to, silicon dioxide, silicon nitride, or silicon oxynitride, or any known low-k material having a relative permittivity below 4.0. Source/drain metallization 1050 may include one or more metals (e.g., Ti, W, Pt, their alloys, and nitrides) that forms an ohmic or tunneling junction with source/drain semiconductor 1040. No source/drain metallization is shown over source/drain semiconductor 1060, which is a structural feature of embodiments herein that couple source/drain semiconductor 1060 to back-side metallization (not depicted in FIG. 10). As such, an insulative dielectric 1090 extends over source/drain semiconductor 1060, enabling overlying metallization layers (not depicted in FIG. 10) to extend over source/drain semiconductor 1060 without shorting the transistor terminal.

Figure 11A:
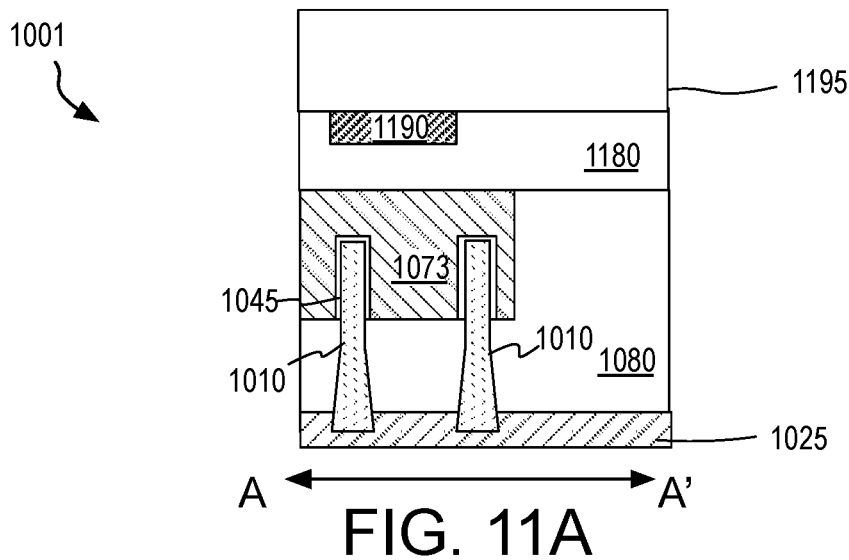
FIG. 11A-11C are cross-sectional views of a transistor cell fabricated with a 3D fabrication method, in accordance with some embodiments.
Figure 11B:
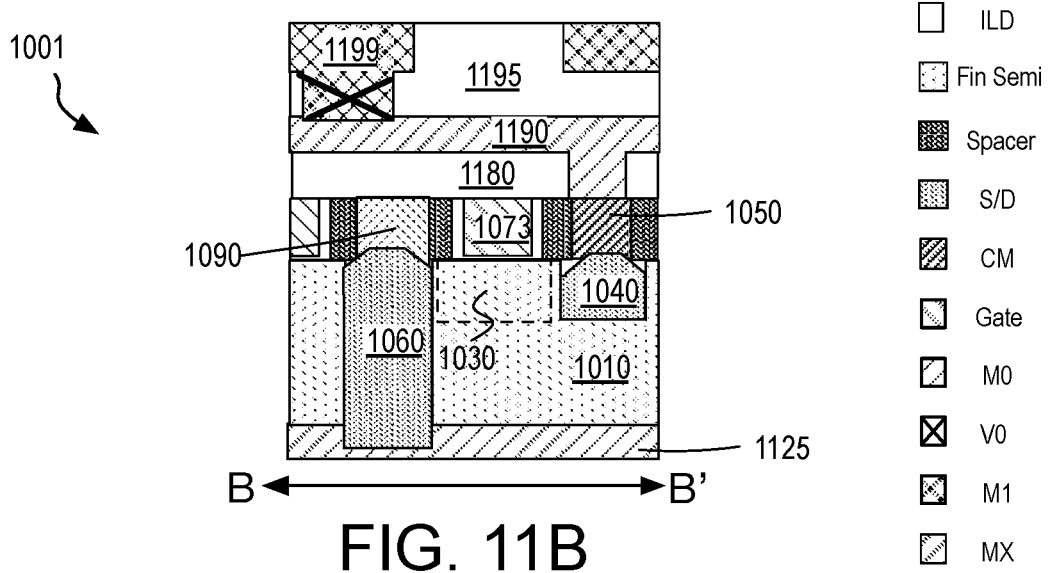
Figure 11C:
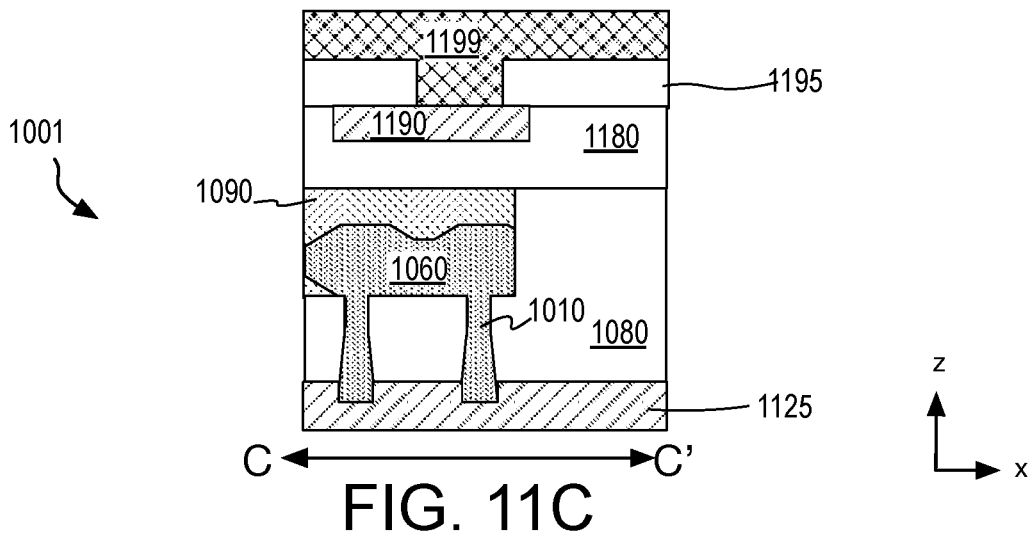

FIG. 11A-11C are cross-sectional views of transistor cell 1001 fabricated with a 3D fabrication method, in accordance with some embodiments. Transistor cell 1001 includes semiconductor bodies 1010, gate electrode 1073, gate dielectric 1045, source/drain regions 1040, 1060. Channel region 1030 is highlighted in dashed line. Source/drain metallization 1050 contacts source/drain semiconductor 1040. Dielectric 1090 is disposed over source/drain semiconductor 1060. Source/drain semiconductor 1060 extends to a back side of semiconductor bodies 1010, as one example of a 3D interconnect enabling back-side source terminal power supply through back-side metal interconnect level 1125. Such a 3D interconnect may facilitate a reduction in the front-side metal track count, as described elsewhere herein. For example in FIG. 11A-11C, a first front-side metallization level (e.g., M0) track 1190 may extend orthogonal to gate electrode 1073 and contact source/drain metallization 1050. Metallization track 1190 is then electrically coupled to an upper level metallization track (e.g., M1) 1199 extending orthogonally to track 1190. In accordance with some advantageous embodiments, metallization track 1199 is one of a plurality of such tracks patterned to have one or more features of the crenellated layout described elsewhere herein. As such, device cells (e.g., 301-304) may each include one or more transistor cells 1001, as described in FIG. 10-11C. Hence, while a crenellated metal track layout is not limited to 3D interconnected device cells, 3D interconnection of the type illustrated by FIG. 11A-11C may offer synergy with crenellated metal track layouts as the front-side metal interconnect routing density may be relaxed relative to a footprint of a transistor cell (e.g. cell 1001). As noted above, this front-side interconnect density reduction may enable a layout that may advantageously include crenellated interconnect tracks.

Figure 12:
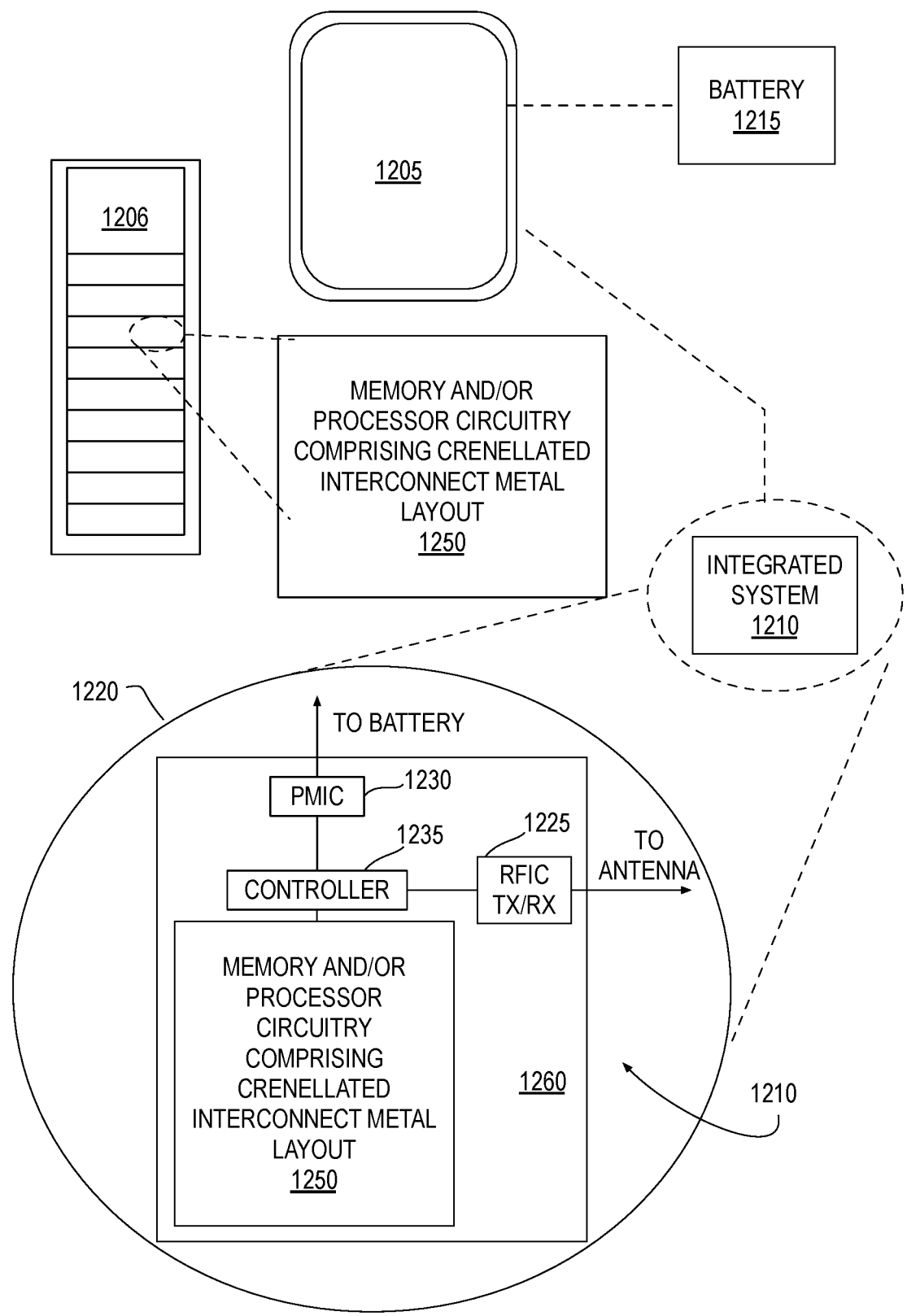
FIG. 12 illustrates a mobile computing platform and a data server machine employing an SoC having a plurality of standard cells with a crenellated metal trace layout, in accordance with embodiments.

FIG. 12 illustrates a mobile computing platform and a data server machine employing an IC including device cells having a crenellated interconnect track layout, for example in accordance with embodiments described elsewhere herein. The server machine 1206 may be any commercial server, for example including any number of high-performance computing platforms disposed within a rack and networked together for electronic data processing, which in the exemplary embodiment includes a packaged monolithic SoC 1250. The mobile computing platform 1205 may be any portable device configured for each of electronic data display, electronic data processing, wireless electronic data transmission, or the like. For example, the mobile computing platform 1205 may be any of a tablet, a smart phone, laptop computer, etc., and may include a display screen (e.g., a capacitive, inductive, resistive, or optical touchscreen), a chip-level or package-level integrated system 1210, and a battery 1215.

Either disposed within the integrated system 1210 illustrated in the expanded view 1220, or as a stand-alone packaged chip within the server machine 1206, monolithic SoC 1250 includes a processor block (e.g., a microprocessor, a multi-core microprocessor, graphics processor, or the like) having a crenellated interconnect track layout, for example in accordance with embodiments described elsewhere herein. The monolithic SoC 1250 may be further coupled to a board, a substrate, or an interposer 1260 along with, one or more of a power management integrated circuit (PMIC) 1230, RF (wireless) integrated circuit (RFIC) 1225 including a wideband RF (wireless) transmitter and/or receiver (TX/RX) (e.g., including a digital baseband and an analog front end module further comprises a power amplifier on a transmit path and a low noise amplifier on a receive path), and a controller 1235. Any or all of RFIC 1225 and PMIC 1230 may also include cells having a crenellated interconnect track layout, for example in accordance with embodiments described elsewhere herein.

Functionally, PMIC 1230 may perform battery power regulation, DC-to-DC conversion, etc., and so has an input coupled to battery 1215 and with an output providing a current supply to other functional modules. As further illustrated, in the exemplary embodiment, RFIC 1225 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G+, and beyond. In alternative implementations, each of these board-level modules may be integrated onto separate ICs or integrated into monolithic SoC 1250.

Figure 13:
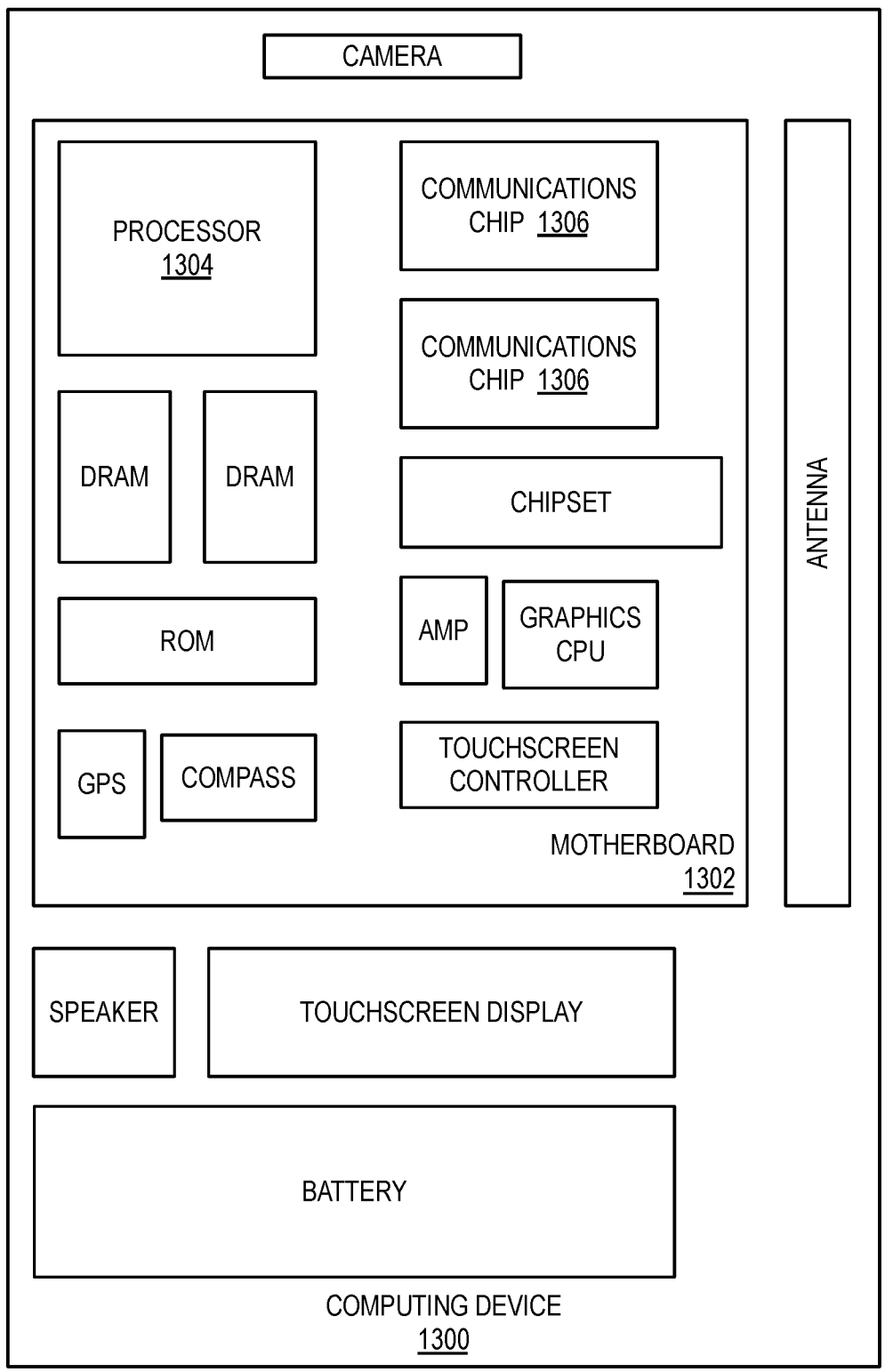
FIG. 13 is a functional block diagram of an electronic computing device, in accordance with some embodiments.

FIG. 13 is a functional block diagram of an electronic computing device, in accordance with some embodiments. Computing device 1300 may be found inside platform 1305 or server machine 1306, for example. Device 1300 further includes a motherboard 1302 hosting a number of components, such as, but not limited to, a processor 1304 (e.g., an applications processor), which may further incorporate device cells with a crenellated interconnect track layout, for example in accordance with embodiments described herein. Processor 1304 may be physically and/or electrically coupled to motherboard 1302. In some examples, processor 1304 includes an integrated circuit die packaged within the processor 1304. In general, the term "processor" or "microprocessor" may refer to any device or portion of a device that processes electronic data from registers and/or memory to transform that electronic data into other electronic data that may be further stored in registers and/or memory.

In various examples, one or more communication chips 1306 may also be physically and/or electrically coupled to the motherboard 1302. In further implementations, communication chips 1306 may be part of processor 1304. Depending on its applications, computing device 1300 may include other components that may or may not be physically and electrically coupled to motherboard 1302. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1306 may enable wireless communications for the transfer of data to and from the computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1306 may implement any of a number of wireless standards or protocols, including but not limited to those described elsewhere herein. As discussed, computing device 1300 may include a plurality of communication chips 1306. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure. For example, the above embodiments may include specific combinations of features as further provided below.

In one or more first example, an integrated circuit (IC) cell has a crenellated trace layout, wherein the crenellated trace layout include a plurality of traces extending in a direction, and individual traces of the plurality intersect only one boundary of the cell, and adjacent ones of the plurality are staggered to intersect boundaries on opposite sides of the cell.

In one or more second examples, for any of the first examples individual traces of the plurality are within a first interconnect level, and have an end that is laterally offset from that of an adjacent trace by at least a width of an orthogonal trace within a second interconnect level.

In one or more third examples, for any of the first or second examples the end of individual traces of the plurality is laterally offset from that of an adjacent trace by approximately the width of an orthogonal trace in the second interconnect level summed with half the distance separating the orthogonal trace from an adjacent trace in the second interconnect level.

In one or more fourth examples, a conductive via coupling the orthogonal trace to at least one of the crenellated traces.

In one or more fifth examples, for any of the fourth examples the is separated from the end of a crenellated trace by approximately half the distance separating the orthogonal trace from an adjacent trace in the second interconnect level.

In one or more sixth examples, for any of the fifth examples the IC cell includes a plurality of gate electrodes extending in the first direction and each coupled to a transistor channel. The IC cell includes a back-side interconnect trace coupled to a transistor source terminal, the back-side interconnect trace disposed over a side of the transistor channel opposite that of a gate electrode.

In one or more seventh examples, an integrated IC block comprises the IC cell in any of the first, second, third, fourth, fifth, or six examples, and includes a second IC cell sharing one boundary with the first IC cell. The second IC cell has a second crenellated trace layout in the first metal interconnect level. The second crenellated trace layout comprises a second plurality of traces extending in the direction, traces of the second plurality intersecting only one boundary of the second IC cell, and having second ends that are laterally offset from each other in the direction by at least the width of an orthogonal trace in a second interconnect level. A trace of the plurality intersecting the shared boundary is laterally offset in the direction from a trace of the second plurality by at least the width of an orthogonal trace in the second interconnect level.

In one or more eighth examples, for the IC block in any of the seventh examples the crenellated trace layout has a crenellation phase complementary to a second crenellation phase of the second crenellated layout. Individual traces of the first cell that are not laterally offset from a trace of the second cell by at least the width of an orthogonal trace in the second interconnect level have continuity with the trace of the second cell.

In one or more ninth examples, for the IC block in any of the seventh or eighth examples, the crenellated trace layouts of the first and second cells have the same crenellation phase. Individual traces of the plurality are aligned in the second direction with individual traces of the second plurality, and no traces of the plurality that intersect the shared boundary has continuity with any traces of the second plurality that intersect the shared boundary.

In one or more tenth examples, for any of the seventh, eighth, or ninth examples the crenellated trace layouts of the first and second cells have the same crenellation phase. A subset of the plurality of traces are aligned in a second direction, orthogonal to the first direction, with a subset of the second plurality of traces. The traces aligned in the second direction that also intersect the shared boundary have continuity across the shared boundary.

In one or more eleventh examples, an integrated circuit (IC) cell includes a transistor gate electrode trace extending in a first direction over a first transistor channel. The IC cell includes a first interconnect level comprising at least a first interconnect trace adjacent to a second interconnect trace and extending in a second direction over the gate electrode trace, wherein the first and second interconnect traces have a first trace width and are separated from one another by an interconnect trace spacing. The IC cell includes a second interconnect level comprising at least a third interconnect trace adjacent to a fourth interconnect trace and extending in the first direction. The third interconnect trace extends over the first interconnect trace and has a trace end located over the first interconnect trace spacing adjacent to the first interconnect trace. The fourth interconnect traces extends over the second interconnect trace, but not over the first interconnect trace, and has an end laterally offset in the first direction from that of the third interconnect trace by a distance at least equal to the first trace width.

In one or more twelfth examples, for any of the eleventh examples the trace end of the third interconnect trace is laterally offset from an edge of the first interconnect trace by approximately half the interconnect trace spacing. The trace end of the fourth interconnect trace is laterally offset in the first direction from that of the third interconnect trace by approximately the first trace width summed with half the interconnect trace spacing.

In one or more thirteenth examples, for any of the eleventh or twelfth examples the first interconnect level further comprises a fifth interconnect trace extending in the second direction over the gate electrode trace and adjacent to the second interconnect trace, and a sixth interconnect trace extending in the second direction over the gate electrode trace and adjacent to the fifth interconnect trace. The third and fourth interconnect traces extend over at least one of the fifth and sixth interconnect traces.

In one or more fourteenth examples, for any of the thirteenth examples the third interconnect trace extends over the fifth interconnect trace and has a second trace end located over the interconnect trace spacing between the fifth and sixth interconnect traces. The fourth interconnect trace extends over the fifth and sixth interconnect traces and has a second trace end laterally offset in the first direction from an end of the third interconnect trace by at least the first trace width.

In one or more fifteenth examples, for any of the fourteenth examples the third and fourth traces have the same length in the first direction.

In one or more sixteenth examples, for any of the fifteenth examples the second interconnect level further comprises a seventh interconnect trace extending in the first direction and adjacent to the fourth interconnect trace, and an eighth interconnect trace extending in the first direction and adjacent to the seventh interconnect trace. The seventh interconnect trace extends over the first interconnect trace and has a trace end located over the interconnect trace spacing adjacent to the first interconnect trace. The eighth interconnect traces extends over the second interconnect trace, but not the first interconnect trace, and has a trace end laterally offset from that of the seventh interconnect trace by a distance in the first direction that is at least equal to the first trace width.

In one or more seventeenth examples, for any of the sixteenth examples the seventh interconnect trace extends extends over the fifth interconnect trace and has a second trace end located over the interconnect trace spacing between the fifth and sixth interconnect traces. The eighth interconnect trace extends over the fifth and sixth interconnect traces and has a second trace end laterally offset from that of the third interconnect trace in the first direction by a distance that is at least equal to the first trace width.

In one or more eighteenth examples, for any of the sixteenth examples the first trace ends of the first and seventh interconnect traces are aligned with each other. The first trace ends of the second and eighth interconnect traces are aligned with each other. The second trace ends of the first and seventh interconnect traces are aligned with each other. The second trace ends of the second and eighth interconnect traces are aligned with each other.

In one or more nineteenth examples, for any of the eleventh, twelfth, thirteenth, fourteenth, fifteenth, sixteenth, seventeenth, or eighteenth examples the IC cell includes a second gate electrode trace extending in the first direction over a second transistor channel and adjacent to the gate electrode. The gate electrode trace is located between the third and fourth interconnect traces. The second gate electrode trace is located between the seventh and eighth interconnect traces.

In one or more twentieth examples, for any of the eleventh, twelfth, thirteenth, fourteenth, fifteenth, sixteenth, seventeenth, eighteenth, or nineteenth examples, the IC cell further comprises a via interconnecting at least one of the first, second, fourth or fifth interconnect traces to at least one of the third, fourth, fifth, or sixth interconnect traces.

In one or more twenty-first examples, for any of the eleventh, twelfth, thirteenth, fourteenth, fifteenth, sixteenth, seventeenth, eighteenth, nineteenth, or twentieth examples, the IC cell further comprise a back-side interconnect trace coupled to a transistor source terminal. At least one of the first, second, fourth or fifth interconnect traces is coupled to a transistor drain terminal.

In one or more twenty-second examples, a method of fabricating an integrated circuit (IC) cell includes forming a gate electrode extending in a first direction over a transistor channel semiconductor. The method includes forming a first interconnect level comprising at least a first interconnect trace adjacent to a second interconnect trace and extending in a second direction over the gate electrode, wherein the first and second interconnect traces have a first trace width and are separated from one another in the first direction by an interconnect trace spacing. The method includes forming a second interconnect level over the first interconnect level, the second interconnect level comprising a plurality of crenellated traces extending in a first direction. Individual traces of the plurality intersect only one boundary of the cell. Adjacent traces of the plurality are staggered in the first direction to intersect boundaries on opposite sides of the cell. Individual traces of the plurality have an end that is laterally offset from that of an adjacent trace by a distance in the first direction that is at least equal to the first trace width.

In one or more twenty-third examples, for any of the twenty-second examples, forming the second interconnect level further comprises forming at least a third interconnect trace adjacent to a fourth interconnect trace and extending in the first direction. The third interconnect trace extends over the first interconnect trace and has a trace end located over the interconnect trace spacing adjacent to the first interconnect trace. The fourth interconnect traces extends over the second interconnect trace, but not the first interconnect trace, and has a trace end laterally offset from that of the third interconnect trace by a distance in the first direction that is at least equal to the first trace width.

It will be recognized that principles of the disclosure are not limited to the embodiments so described, but can be practiced with modification and alteration without departing from the scope of the appended claims. For example the above embodiments may include specific combinations of features as further provided below.

What is claimed is:

1. An integrated circuit (IC) structure, comprising:
a plurality of gate electrodes that extend in a first direction over a front side of corresponding channel regions of a plurality of transistors;
a plurality of first traces within a first interconnect level, wherein each of first traces extend over all of the gate electrodes in a second direction, orthogonal to the first direction, and wherein individual ones of the first traces are coupled to a drain region of at least one of the transistors;
a plurality of second traces within a second interconnect level, wherein each of the second traces extend over at least one of the first traces, wherein all of the second traces extend a same length in the first direction, and immediately adjacent ones of the second traces have first and second opposite ends that are laterally staggered from each other in the first direction by approximately a width of the first traces summed with half a distance between immediately adjacent ones of the first traces;
a conductive via coupling at least one of the first traces to at least one of the second traces; and
a back-side interconnect trace coupled to a source region of at least one of the transistors, the back-side interconnect trace under a back side of the transistor channel regions, opposite the front side.

2. The IC structure of claim 1, wherein:
the via is separated from the first or second end of one of the second traces by at least half the distance separating immediately adjacent ones of the first traces.

3. An integrated circuit (IC) structure, comprising:
a transistor gate electrode trace extending in a first direction over a transistor channel;
a first interconnect level comprising at least a first interconnect trace adjacent to a second interconnect trace and extending in a second direction over the gate electrode trace, wherein the first and second interconnect traces have a first trace width and are separated from one another by an interconnect trace spacing; and
a second interconnect level comprising at least a third interconnect trace adjacent to a fourth interconnect trace and extending in the first direction, wherein:
the third interconnect trace extends over the first interconnect trace and has a first trace end located over the first interconnect trace spacing adjacent to the first interconnect trace and laterally offset from an edge of the first interconnect trace by at least half the interconnect trace spacing;
the fourth interconnect trace extends over the second interconnect trace, but not over the first interconnect trace, and has a first trace end laterally offset in the first direction from the first trace end of the third interconnect trace by a distance at least equal to the first trace width; and
second trace ends of the third and fourth interconnect traces are laterally offset in the first direction by the distance, wherein:
the first interconnect level further comprises:
a fifth interconnect trace that extends in the second direction over the gate electrode trace and adjacent to the second interconnect trace; and
a sixth interconnect trace that extends in the second direction over the gate electrode trace and adjacent to the fifth interconnect trace;
the third and fourth interconnect traces extend over at least one of the fifth and sixth interconnect traces;
the third interconnect trace extends over the fifth interconnect trace and the second trace end of the third interconnect trace is located over the interconnect trace spacing between the fifth and sixth interconnect traces; and
the fourth interconnect trace extends over the fifth and sixth interconnect traces and the second trace end of the fourth interconnect trace is laterally offset in the first direction from an end of the third interconnect trace by at least the first trace width.

4. The IC structure of claim 3, wherein:
the second interconnect level further comprises:
a seventh interconnect trace extending in the first direction and adjacent to the fourth interconnect trace; and
an eighth interconnect trace extending in the first direction and adjacent to the seventh interconnect trace;
the seventh interconnect trace extends over the first interconnect trace and has a trace end located over the interconnect trace spacing adjacent to the first interconnect trace; and
the eighth interconnect traces extends over the second interconnect trace, but not the first interconnect trace, and has a trace end laterally offset from that of the seventh interconnect trace by a distance in the first direction that is at least equal to the first trace width.

5. The IC structure of claim 4, wherein:
the seventh interconnect trace extends over the fifth interconnect trace and has a second trace end located over the interconnect trace spacing between the fifth and sixth interconnect traces; and
the eighth interconnect trace extends over the fifth and sixth interconnect traces and has a second trace end laterally offset from that of the third interconnect trace in the first direction by a distance that is at least equal to the first trace width.

6. The IC structure of claim 5, wherein:
the trace ends of the third and seventh interconnect traces are in lateral alignment with each other;
the trace ends of the fourth and eighth interconnect traces are in lateral alignment with each other;
the second trace ends of the third and seventh interconnect traces are in lateral alignment with each other; and
the second trace ends of the fourth and eighth interconnect traces are in lateral alignment with each other.

7. The IC structure of claim 3, further comprising a second gate electrode trace extending in the first direction over a second transistor channel and adjacent to the gate electrode trace, wherein:
the gate electrode trace is located between the third and fourth interconnect traces; and
the second gate electrode trace is located between the seventh and eighth interconnect traces.

8. The IC structure of claim 3, further comprising a via interconnecting at least one of the first, second, fourth or fifth interconnect traces to at least one of the third, fourth, fifth, or sixth interconnect traces.

9. An integrated IC block, comprising:
- a first IC structure having a first trace layout including:
  - a first plurality of traces extending in a direction, wherein individual ones of the traces intersect only one boundary of the first IC structure; and
  - adjacent ones of the first plurality of traces are staggered to intersect a boundary on an opposite side of the first IC structure; and
- a second IC structure sharing one boundary with the first IC structure, wherein:
  - the second IC structure has a second trace layout comprising a second plurality of traces extending in the direction, ones of the second traces intersecting only one boundary of the second IC structure, and having second ends that are laterally offset from each other in the direction by at least the width of an orthogonal trace in a second interconnect level; and
- wherein a trace of the first plurality intersecting the shared boundary is laterally offset in the direction from a trace of the second plurality by at least the width of an orthogonal trace in the second interconnect level; and
- wherein the first trace layout has a crenellation phase complementary to a second crenellation phase of the second layout; and
- wherein individual traces of the first structure that are not laterally offset from a trace of the second structure by at least the width of an orthogonal trace in the second interconnect level have continuity with the trace of the second structure.

10. The IC block of claim 9, wherein:
- the trace layouts of the first and second structures have the same crenellation phase; and
- individual traces of the first plurality are aligned in a second direction with individual traces of the second plurality, and no traces of the first plurality that intersect the shared boundary has continuity with any traces of the second plurality that intersect the shared boundary.

11. The IC block of claim 9, wherein:
- the trace layouts of the first and second structures have the same crenellation phase;
- a subset of the first plurality of traces are aligned in a second direction, orthogonal to the first direction, with a subset of the second plurality of traces; and
- the traces aligned in the second direction that also intersect the shared boundary have continuity across the shared boundary.

12. A method of fabricating an integrated circuit (IC) structure, the method comprising:
- forming a gate electrode extending in a first direction over a transistor channel semiconductor;
- forming a first interconnect level comprising at least a first interconnect trace adjacent to a second interconnect trace and extending in a second direction over the gate electrode, wherein the first and second interconnect traces have a first trace width and are separated from one another in the first direction by an interconnect trace spacing;
- forming a second interconnect level over the first interconnect level, the second interconnect level comprising a plurality of traces extending in the first direction, wherein:
  - individual traces of the plurality intersect only one boundary of the structure;
  - adjacent traces of the plurality are staggered in the first direction to intersect boundaries on opposite sides of the structure; and
- individual traces of the plurality have an end that is laterally offset from that of an adjacent trace by a distance in the first direction that is at least equal to the first interconnect trace width.

13. The IC structure of claim 3, wherein:
- the first trace end of the third interconnect trace is laterally offset from an edge of the first interconnect trace by approximately half the interconnect trace spacing; and
- the first trace end of the fourth interconnect trace is laterally offset in the first direction from that of the third interconnect trace by approximately the first trace width summed with half the interconnect trace spacing.

* * * * *